United States Patent
Chu et al.

(10) Patent No.: US 12,154,939 B2
(45) Date of Patent: Nov. 26, 2024

(54) HIGH CAPACITANCE MIM DEVICE WITH SELF ALIGNED SPACER

(71) Applicant: Taiwan Semiconductor Manufacturing Company, Ltd., Hsinchu (TW)

(72) Inventors: Ching-Sheng Chu, Baoshan Township (TW); Dun-Nian Yaung, Taipei (TW); Yu-Cheng Tsai, Tainan (TW); Meng-Hsien Lin, Tainan (TW); Ching-Chung Su, Tainan (TW); Jen-Cheng Liu, Hsin-Chu (TW); Wen-De Wang, Minsyong Township (TW); Guan-Hua Chen, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 18/360,941

(22) Filed: Jul. 28, 2023

(65) Prior Publication Data
US 2023/0369389 A1     Nov. 16, 2023

Related U.S. Application Data

(62) Division of application No. 17/308,381, filed on May 5, 2021, now Pat. No. 11,769,791.
(Continued)

(51) Int. Cl.
| H01L 29/66 | (2006.01) |
| H01L 29/94 | (2006.01) |
| H01L 49/02 | (2006.01) |

(52) U.S. Cl.
CPC ............ H01L 28/75 (2013.01); H01L 28/87 (2013.01); H01L 28/88 (2013.01); H01L 28/92 (2013.01);
(Continued)

(58) Field of Classification Search
CPC . H10B 12/038; H10B 12/37; H01L 28/90–92; H01L 28/945; H01L 28/75
See application file for complete search history.

(56) References Cited

U.S. PATENT DOCUMENTS

| 8,395,200 B2 | 3/2013 | Chen et al. |
| 9,620,582 B2 * | 4/2017 | Hsieh ...................... H01L 28/90 |

(Continued)

FOREIGN PATENT DOCUMENTS

| DE | 102016116305 A1 | 7/2017 |
| WO | 2018125142 A1 | 7/2018 |

OTHER PUBLICATIONS

Non-Final Office Action dated Jan. 23, 2023 for U.S. Appl. No. 17/308,381.
(Continued)

*Primary Examiner* — Jose R Diaz
(74) *Attorney, Agent, or Firm* — Eschweiler & Potashnik, LLC

(57) ABSTRACT

The present disclosure, in some embodiments, relates to a metal-insulator-metal (MIM) capacitor structure. The MIM capacitor structure includes one or more lower interconnects disposed within a lower dielectric structure over a substrate. A first dielectric layer is over the lower dielectric structure and includes sidewalls defining a plurality of openings extending through the first dielectric layer. A lower electrode is arranged along the sidewalls and over an upper surface of the first dielectric layer, a capacitor dielectric is arranged along sidewalls and an upper surface of the lower electrode, and an upper electrode is arranged along sidewalls and an upper surface of the capacitor dielectric. A spacer is along opposing outermost sidewalls of the upper electrode. The spacer has an outermost surface extending from a lowermost surface of the spacer to a top of the spacer. The outermost surface is substantially aligned with an outermost sidewall of the lower electrode.

20 Claims, 20 Drawing Sheets

Related U.S. Application Data

(60) Provisional application No. 63/142,026, filed on Jan. 27, 2021.

(52) U.S. Cl.
CPC ...... *H01L 29/66181* (2013.01); *H01L 29/945* (2013.01); *H01L 28/40* (2013.01)

(56) References Cited

U.S. PATENT DOCUMENTS

| | | |
|---|---|---|
| 9,679,909 B2 * | 6/2017 | Chuang ............... H01L 27/0629 |
| 2006/0024899 A1 | 2/2006 | Crenshaw et al. |
| 2006/0160319 A1 | 7/2006 | Giraudin et al. |
| 2010/0181645 A1 | 7/2010 | Marenco |
| 2016/0218172 A1 | 7/2016 | Hsieh et al. |
| 2017/0207387 A1 | 7/2017 | Yang et al. |
| 2018/0130871 A1 | 5/2018 | Lin et al. |
| 2018/0366401 A1 | 12/2018 | Suo et al. |
| 2019/0058109 A1 * | 2/2019 | Chen ...................... H10N 50/80 |
| 2020/0106011 A1 | 4/2020 | Chen et al. |
| 2020/0119268 A1 | 4/2020 | Sung et al. |
| 2020/0135845 A1 | 4/2020 | Seidel et al. |
| 2020/0357981 A1 | 11/2020 | Chen et al. |

OTHER PUBLICATIONS

Notice of Allowance dated May 4, 2023 for U.S. Appl. No. 17/308,381.

* cited by examiner

HIGH CAPACITANCE MIM DEVICE WITH SELF ALIGNED SPACER

REFERENCE TO RELATED APPLICATIONS

This application is a Divisional of U.S. application Ser. No. 17/308,381, filed on May 5, 2021, which claims the benefit of U.S. Provisional Application No. 63/142,026, filed on Jan. 27, 2021. The contents of the above-referenced patent applications are hereby incorporated by reference in their entirety.

BACKGROUND

Integrated chips are formed on semiconductor die comprising millions or billions of transistor devices. The transistor devices are configured to act as switches and/or to produce power gains so as to enable logical functionality for an integrated chip (e.g., form a processor configured to perform logic functions). Integrated chips also comprise passive devices, such as capacitors, resistors, inductors, varactors, etc. Passive devices are widely used to control integrated chip characteristics, such as gains, time constants, etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
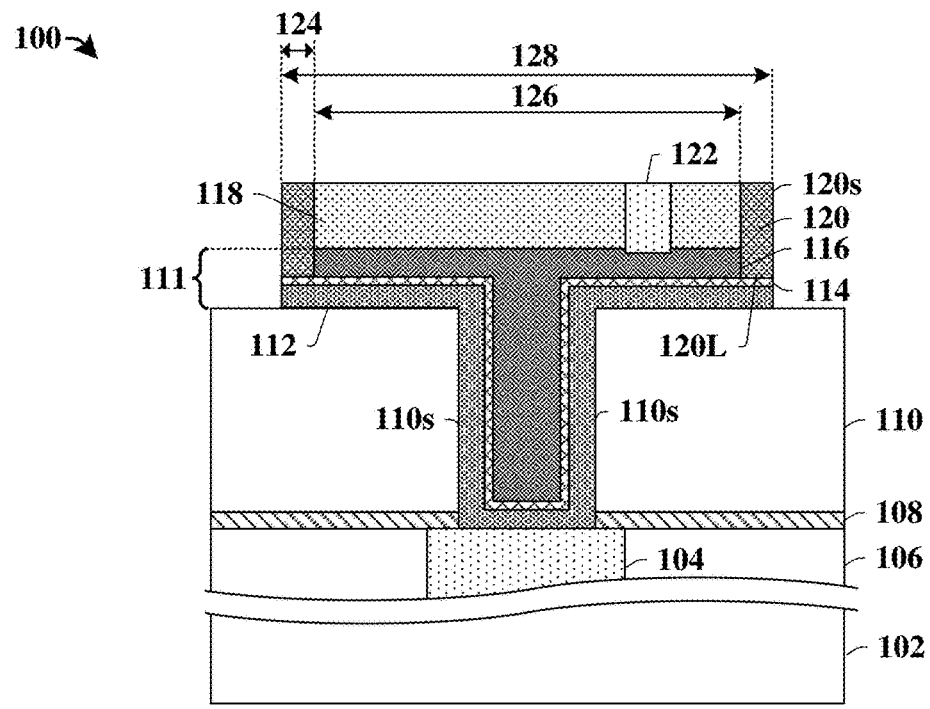
FIG. 1 illustrates a cross-sectional view of some embodiments of an integrated chip having a high density MIM (metal-insulator-metal) capacitor structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A MIM (metal-insulator-metal) capacitor is a passive device that is typically arranged within a back-end-of-the line (BEOL) stack of an integrated chip. A MIM capacitor may be formed by depositing a capacitor dielectric layer over a lower electrode layer and subsequently depositing an upper electrode layer over the capacitor dielectric layer. One or more patterning processes are performed to remove parts of the upper electrode layer, the capacitor dielectric layer, and the lower electrode layer and to define a MIM capacitor having a capacitor dielectric disposed between an upper electrode and a lower electrode.

It has been appreciated that using a single patterning process to remove parts of the upper and lower electrode layers may cause metal from the upper and/or lower electrode layers to re-deposit and/or accumulate along sides of the upper electrode, the lower electrode, and the capacitor dielectric during fabrication, thereby electrically shorting the upper and lower electrodes. To prevent re-deposited metal from shorting the upper and lower electrodes, separate patterning processes may be used to etch the upper and lower electrode layers. For example, the upper electrode layer may be patterned according to a first patterning process that uses a first photomask, while the capacitor dielectric layer and the lower electrode layer may be subsequently patterned according to a second patterning process that uses a second photomask.

However, alignment tolerances between the different photomasks used to form a MIM capacitor cause a lower electrode of a capacitor to have a significantly larger footprint than an upper electrode of the capacitor. For example, an upper electrode may have a footprint that is between 50% and 70% of the lower electrode. Because a capacitance of a MIM capacitor is directly proportional to an area of both the upper and the lower conductive electrodes, such alignment tolerances can cause MIM capacitors to consume a relatively large footprint (e.g., surface area) of an integrated chip to achieve capacitances used in integrated chip applications. For example, a MIM capacitor may have a footprint that is on the order of approximately 10 microns. Furthermore, while the minimum feature sizes of integrated chips (e.g., gate sizes, metal interconnect sizes, etc.) continue to decrease, a MIM capacitor is unable to similarly scale its size without decreasing its capacitance. Therefore, as the minimum features sizes of integrated chips decrease MIM capacitors are consuming proportionally larger areas of a substrate to achieve a same capacitance, and thus are becoming increasingly expensive.

The present disclosure relates to a method of forming a MIM device comprising upper and lower electrodes with footprints having similar sizes (e.g., having footprints with sizes that are within approximately 10% of one another). In some embodiments, the method may be performed by forming a capacitor dielectric layer over the lower electrode layer, and forming an upper electrode layer over the capacitor dielectric layer. A first etching process is performed to pattern the upper electrode layer and define an upper electrode. A spacer layer is subsequently formed over horizontally extending surfaces of the upper electrode and the capacitor dielectric layer and also along sidewalls of the upper electrode. The spacer layer is etched using a second etching process that removes the spacer layer from over the horizontally extending surfaces of the upper electrode and the capacitor dielectric layer, and that defines a self-aligned spacer along the sidewalls of the upper electrode. A third etching process is subsequently performed to pattern the capacitor dielectric layer and the lower electrode layer according to the self-aligned spacer. Using the self-aligned spacer to pattern the lower electrode layer allows for the upper and lower electrodes to be formed to have footprints with similar sizes. By forming upper and lower electrodes with footprints that have similar sizes, a capacitance of a resulting MIM device can be improved without increasing an overall footprint of the MIM device.

FIG. 1 illustrates a cross-sectional view of some embodiments of an integrated chip 100 having a high density MIM (metal-insulator-metal) capacitor structure.

The integrated chip 100 comprises one or more lower interconnects 104 disposed within a lower dielectric structure 106 over a substrate 102. A first etch stop layer 108 is disposed over the lower dielectric structure 106 and a first dielectric layer 110 is disposed over the first etch stop layer 108. The first dielectric layer 110 comprises one or more sidewalls 110s that define an opening extending through the first dielectric layer 110.

A MIM capacitor structure 111 is arranged over the one or more lower interconnects 104. The MIM capacitor structure 111 comprises a capacitor dielectric 114 disposed vertically between a lower electrode 112 and an upper electrode 116. In some embodiments, the MIM capacitor structure 111 extends through the opening in the first dielectric layer 110 to electrically contact the one or more lower interconnects 104. In some such embodiments, the capacitor dielectric 114 may be disposed both vertically and laterally between the lower electrode 112 and the upper electrode 116. In such embodiments, the lower electrode 112 is arranged along an upper surface and the one or more sidewalls 110s of the first dielectric layer 110, the capacitor dielectric 114 is arranged along an upper surface and one or more sidewalls of the lower electrode 112, and the upper electrode 116 is arranged along an upper surface and one or more sidewalls of the capacitor dielectric 114. In some embodiments, a capping structure 118 is arranged over the upper electrode 116. In some such embodiments, an upper interconnect structure 122 (e.g., an interconnect via) extends through the capping structure 118 to contact the upper electrode 116.

A spacer 120 (e.g., a self-aligned spacer) is arranged along opposing outermost sidewalls of the upper electrode 116 and the capping structure 118. The spacer 120 has a lowermost surface 120L that is disposed on an upper surface of the capacitor dielectric 114. In some embodiments, the lowermost surface 120L of the spacer 120 directly contacts the upper surface of the capacitor dielectric 114. In some additional embodiments, an entirety of the spacer 120 is completely confined over the upper surface of the capacitor dielectric 114. The spacer 120 has an outermost surface 120s that continuously extends between an uppermost surface of the spacer 120 and the lowermost surface 120L of the spacer 120. The outermost surface 120s of the spacer 120 is substantially aligned with outermost sidewalls of the capacitor dielectric 114 and the lower electrode 112. In some embodiments, the outermost surface 120s of the spacer 120 and the outermost sidewalls of the capacitor dielectric 114 and the lower electrode 112 form a substantially smooth surface.

The spacer 120 has a width 124 that is relatively small. For example, the spacer 120 may have a width 124 that is in a range of between approximately 50 Angstroms (Å) and approximately 1,000 Å, between approximately 250 Å and approximately 750 Å, between approximately 400 Å and approximately 600 Å, approximately 500 Å, or other similar values. During fabrication, the spacer 120 is used as a mask in an etching process that defines the capacitor dielectric 114 and the lower electrode 112. Because of the relatively small width 124 of the spacer 120, the lower electrode 112 can be formed to have a footprint that is similar to that of the upper electrode 116. For example, in some embodiments, the upper electrode 116 may have a first footprint 126 that covers between approximately 90% and approximately 95% of a second footprint 128 of the lower electrode 112. In other embodiments, the first footprint 126 of the upper electrode 116 may cover between approximately 85% and approximately 99% of the second footprint 128. By having the first footprint 126 of the upper electrode 116 with a similar size to the second footprint 128 of the lower electrode 112, a capacitance of the MIM capacitor structure 111 can be improved without increasing an overall footprint of the MIM capacitor structure 111. For example, a MIM capacitor structure formed using separate photomasks to define the upper and lower electrodes may have a capacitance that is between 50% and 75% of a capacitance of a disclosed MIM capacitor structure that has a same footprint and that uses a self-aligned spacer to define the lower electrode (e.g., a capacitor formed using separate patterning processes may have a capacitance of approximately 175 femto-Farads (fF) to approximately 225 fF, while a disclosed MIM capacitor structure with a same footprint may have a capacitance of approximately 345 fF to approximately 400 fF)

Figure 2:
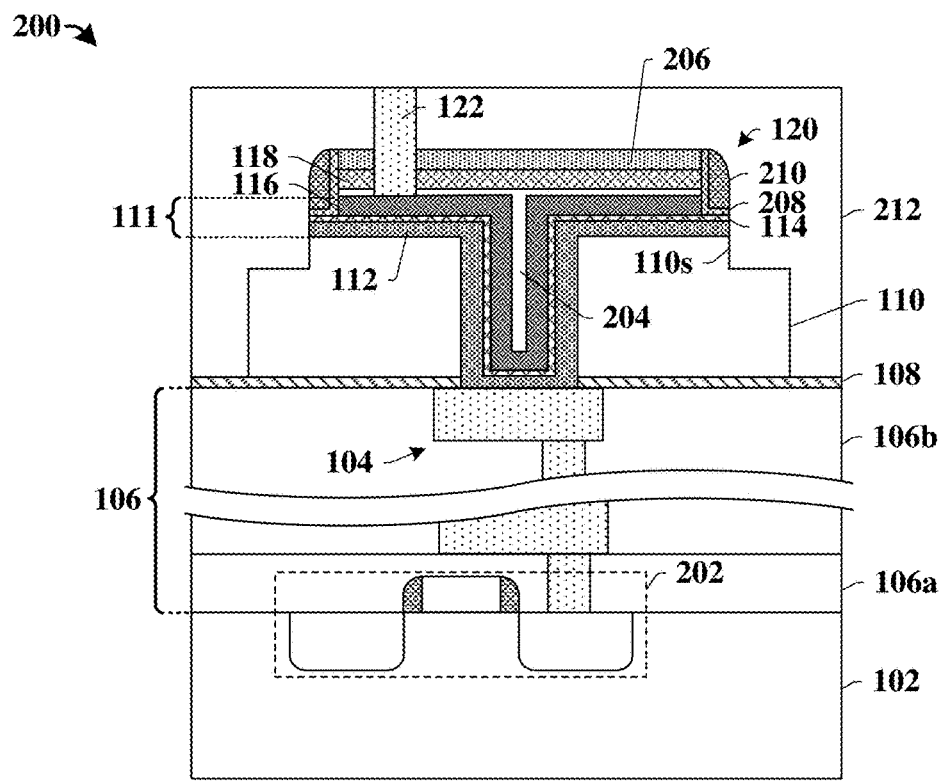
FIG. 2 illustrates a cross-sectional view of some additional embodiments of an integrated chip having a high density MIM capacitor structure.

FIG. 2 illustrates a cross-sectional view of some additional embodiments of an integrated chip 200 having a high density MIM capacitor structure.

The integrated chip 200 comprises one or more lower interconnects 104 disposed within a lower dielectric structure 106 over a substrate 102. In some embodiments, the one or more lower interconnects 104 may be coupled to a transistor device 202 disposed within the substrate 102. The lower dielectric structure 106 may comprise a plurality of stacked inter-level dielectric (ILD) layers 106a-106b disposed over the substrate 102. In some embodiments, the plurality of stacked ILD layers 106a-106b may comprise one or more of silicon dioxide, silicon nitride, carbon doped silicon dioxide, silicon oxynitride, borosilicate glass (BSG), phosphorus silicate glass (PSG), borophosphosilicate glass (BPSG), fluorosilicate glass (FSG), undoped silicate glass (USG), a porous dielectric material, or the like. In some embodiments, the one or more lower interconnects 104 may comprise one or more of a middle-of-line (MOL) interconnect, a conductive contact, an interconnect wire, an interconnect via, or the like. In some embodiments, the one or more lower interconnects 104 may comprise one or more of copper, tungsten, ruthenium, aluminum, and/or the like.

A first etch stop layer 108 is disposed over the lower dielectric structure 106 and a first dielectric layer 110 is disposed over the first etch stop layer 108. A MIM capacitor structure 111 is arranged over the first dielectric layer 110. The MIM capacitor structure 111 extends through the first dielectric layer 110 and the first etch stop layer 108 to electrically contact the one or more lower interconnects 104. In some embodiments, the MIM capacitor structure 111 comprises a lower electrode 112 arranged along an upper surface and one or more sidewalls of the first dielectric layer 110, a capacitor dielectric 114 arranged along an upper surface and one or more sidewalls of the lower electrode 112, and an upper electrode arranged an upper surface and one or more sidewalls of the capacitor dielectric 114.

In some embodiments, the lower electrode 112 and the upper electrode 116 may respectively comprise a metal such as aluminum, copper, tantalum, titanium, tantalum nitride, titanium nitride, tungsten, and/or the like. In some embodiments, the lower electrode 112 comprises a same metal as the upper electrode 116, while in other embodiments the lower electrode 112 and the upper electrode 116 may comprise different metals. The lower electrode 112 and the upper electrode 116 respectively have a thickness that is in a range of between approximately 10 Angstroms (Å) and approximately 200 Å, between approximately 50 Å and approximately 100 Å, or other similar values. In some embodiments, the capacitor dielectric 114 may comprise a high-k dielectric material. In some embodiments, the capacitor dielectric 114 may comprise one or more of aluminum oxide ($Al_2O_3$), hafnium oxide ($HfO_2$), silicon dioxide ($SiO_2$), silicon carbide (SiC), silicon mononitride (SiN), silicon nitride ($Si_3N_4$), tantalum nitride ($Ta_2O_5$), tantalum oxynitride (TaON), titanium oxide ($TiO_2$), zirconium oxide ($ZrO_2$), or the like.

In some embodiments a dielectric 204 covers an upper surface of the upper electrode 116 and extends between interior sidewalls of the upper electrode 116. In some embodiments, the dielectric 204 continuously extends from over the upper electrode 116 to directly between the interior sidewalls of the upper electrode 116. In some embodiments, the dielectric 204 may comprise an oxide (e.g., silicon oxide, silicon dioxide), a nitride (e.g., silicon nitride), or the like.

A capping structure 118 is arranged over the upper electrode 116. In some embodiments, the capping structure 118 is vertically separated from the upper electrode 116 by way of the dielectric 204. In some embodiments, the capping structure 118 is configured to prevent interaction between adjacent layers (e.g., to prevent diffusion from the capacitor metal layers to an adjacent dielectric material) and/or to protect underlying layers during manufacturing. In some embodiments, a capping structure 118 may comprise a dielectric material such as silicon oxynitride, silicon oxycarbide, or the like. The capping structure 118 and the masking layer 206 have substantially equal widths. In some embodiments, a masking layer 206 is arranged over the capping structure 118. In some embodiments, the masking layer may comprise an anti-reflective layer. In various embodiments, the masking layer 206 may comprise a dielectric such as silicon nitride, silicon carbide, or the like.

A spacer 120 is arranged along opposing sides of the upper electrode 116, the capping structure, and/or the masking layer 206. The spacer 120 has an outermost surface that faces away from the upper electrode 116 and that continuously extends between a lowermost surface of the spacer 120 and a top and/or a topmost surface of the spacer 120. In some embodiments, the outermost surface of the spacer 120 may comprise a curved surface. For example, the outermost surface of the spacer 120 may comprise a vertically extending segment and a curved segment over the vertically extending segment. In some such embodiments, the vertically extending segment is substantially aligned with outermost sidewalls of the capacitor dielectric 114 and the lower electrode 112. In some embodiments, the first dielectric layer 110 may comprise a sidewall 110s that is also substantially aligned with the vertically extending segment of the spacer 120. In some embodiments, the spacer 120 comprises outermost sidewalls that are completely confined between an outermost sidewall of the upper electrode 116 facing a first direction and an outermost sidewall of the lower electrode 112 facing the same first direction.

In some embodiments, the spacer 120 comprises a first dielectric 208 and a second dielectric 210 over the first dielectric 208. The first dielectric 208 extends along a lower surface and a sidewall of the second dielectric 210. The first dielectric 208 comprises a horizontally extending segment separating the second dielectric 210 from the capacitor dielectric 114 and a vertically extending segment separating the second dielectric 210 from the upper electrode 116 and the capping structure 118. In some embodiments, the first dielectric 208 may comprise a first dielectric material and the second dielectric 210 may comprise a second dielectric material that is different than the first dielectric material. In some embodiments, the first dielectric 208 may comprise an oxide (e.g., silicon dioxide, silicon rich oxide, or the like), while the second dielectric 210 may comprise a nitride (e.g., silicon nitride), a carbide (e.g., silicon carbide), or the like.

A second dielectric layer 212 is arranged over the MIM capacitor structure 111 and the first dielectric layer 110. In some embodiments, the second dielectric layer 212 is arranged along an upper surface and the sidewall 110s of the first dielectric layer 110. In some embodiments, the second dielectric layer 212 may have a single sidewall that extends along the outer surface of the spacer 120, the outermost sidewalls of the capacitor dielectric 114 and the lower electrode 112, and along the sidewall 110s of the first dielectric layer 110. In some embodiments, the second dielectric layer 212 may comprise one or more of silicon dioxide, silicon nitride, carbon doped silicon dioxide, silicon oxynitride, BSG, PSG, BPSG, FSG, USG, a porous dielectric material, or the like. In some embodiments, an upper interconnect structure 122 (e.g., an interconnect via) extends through the second dielectric layer 212, the masking layer 206, the capping structure 118, and the dielectric 204 to contact the upper electrode 116.

Figure 3A:
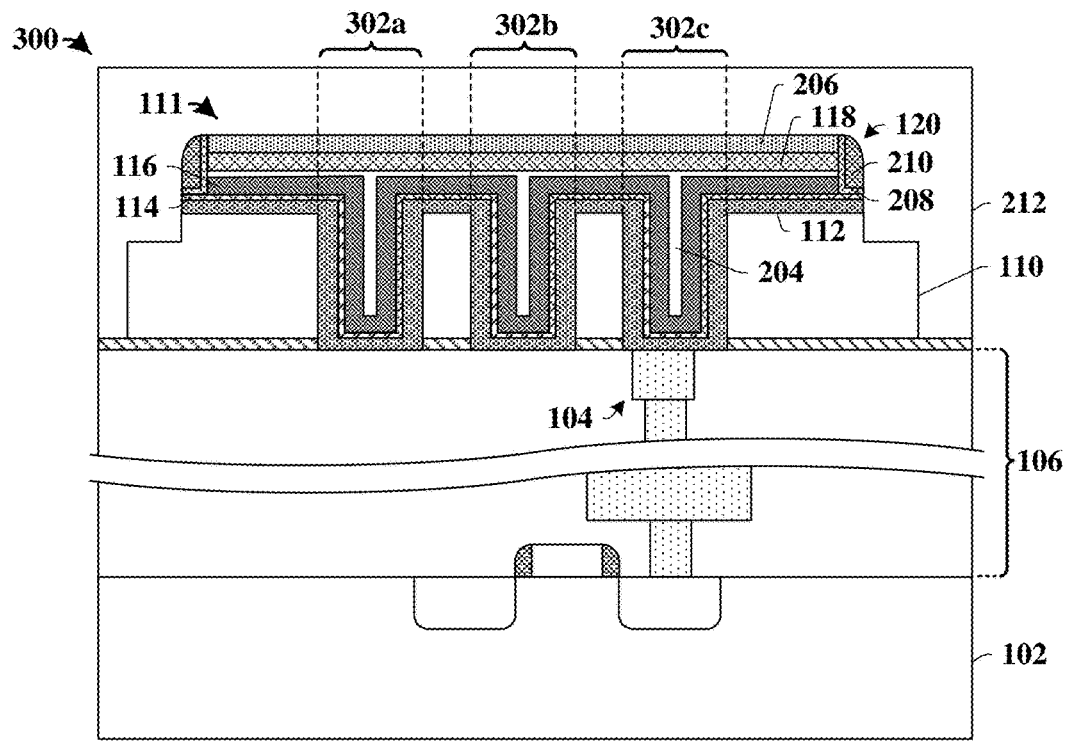
FIGS. 3A-3D illustrate some additional embodiments of an integrated chip having a high density MIM capacitor structure.

FIG. 3A illustrates a cross-sectional view of some additional embodiments of an integrated chip 300 having a high density MIM capacitor structure comprising a plurality of protrusions extending outward from a lower surface of the MIM capacitor structure.

The integrated chip 300 comprises a first dielectric layer 110 disposed over a substrate 102. The first dielectric layer 110 comprises sidewalls defining a plurality of openings extending through the first dielectric layer 110. A MIM capacitor structure 111 is arranged over the first dielectric layer 110 and comprises a plurality of protrusions 302a-302c that extend outward from a lower surface of the MIM capacitor structure 111 to within the plurality of openings. The plurality of protrusions 302a-302c respectively comprise a lower electrode 112, a capacitor dielectric 114, and an upper electrode 116. In some embodiments, the plurality of protrusions 302a-302c further comprise a dielectric 204. One or more of the plurality of protrusions 302a-302c contact one or more lower interconnects 104 within a lower dielectric structure 106 between the first dielectric layer 110 and the substrate 102.

By having a plurality of protrusions 302a-302c extending outward from the lower surface of the MIM capacitor structure 111, a capacitance of the MIM capacitor structure 111 can be further increased since the protrusions increase a surface area of the upper electrode 116 and the lower electrode 112. For example, a MIM capacitor structure 111 with three protrusions may have a capacitance that is between approximately 50% and approximately 70% greater than a MIM capacitor structure with 2 protrusions. In some embodiments, the plurality of protrusions 302a-302c may comprise three protrusions. In other embodiments (not shown), the plurality of protrusions 302a-302c may comprise more than three protrusions (e.g., 4 protrusions, 5 protrusions, etc.).

Figure 3B:
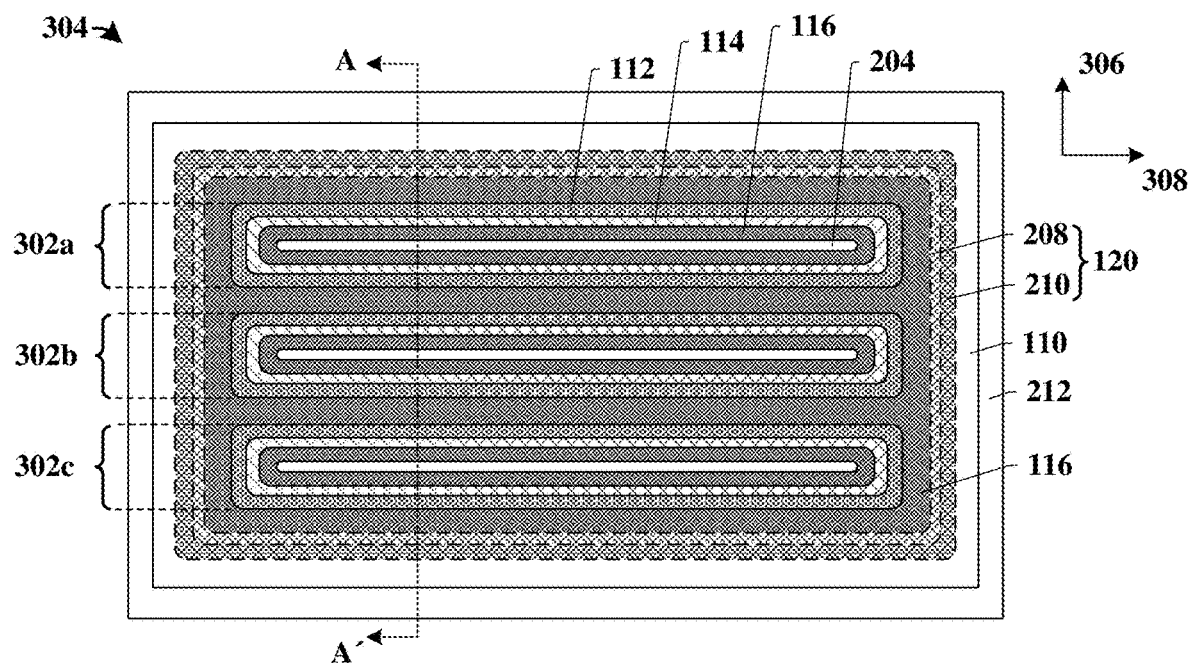

FIG. 3B illustrates a top-view 304 of the integrated chip of FIG. 3A. The cross-sectional view of FIG. 3A is taken along cross-sectional line A-A' of top-view 304.

As shown in top-view 304, the plurality of protrusions 302a-302c of the MIM capacitor structure 111 respectively have a substantially rectangular shape that extends a first distance along a first direction 306 and that extends a second distance along a second direction 308, which is perpendicular to the first direction 306. The second distance is greater than the first distance.

Within each of the plurality of protrusions 302a-302c, the lower electrode 112 completely surrounds the dielectric 204, the capacitor dielectric 114 completely surrounds the lower electrode 112, and the upper electrode 116 completely surrounds the capacitor dielectric 114. The upper electrode 116 continuously extends past the plurality of protrusions 302a-302c along a first direction 306 and along a second direction 308 that is perpendicular to the first direction 306. The spacer 120 extends around a perimeter of the upper electrode 116 in a closed path. The lower electrode 112 and the capacitor dielectric 114 have outermost perimeters that are substantially the same as an outermost perimeter of the spacer 120. In such embodiments, a collective footprint of both the upper electrode 116 and/or the spacer 120 is substantially equal to a footprint of the lower electrode 112.

Figure 3C:
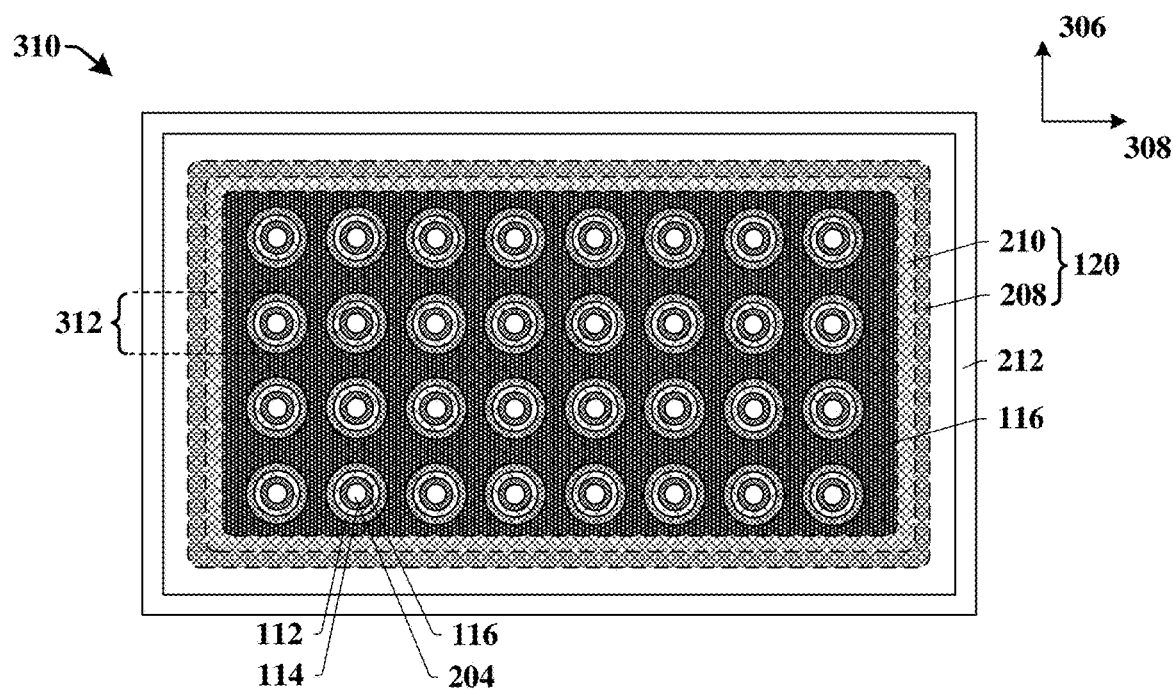
Figure 3D:
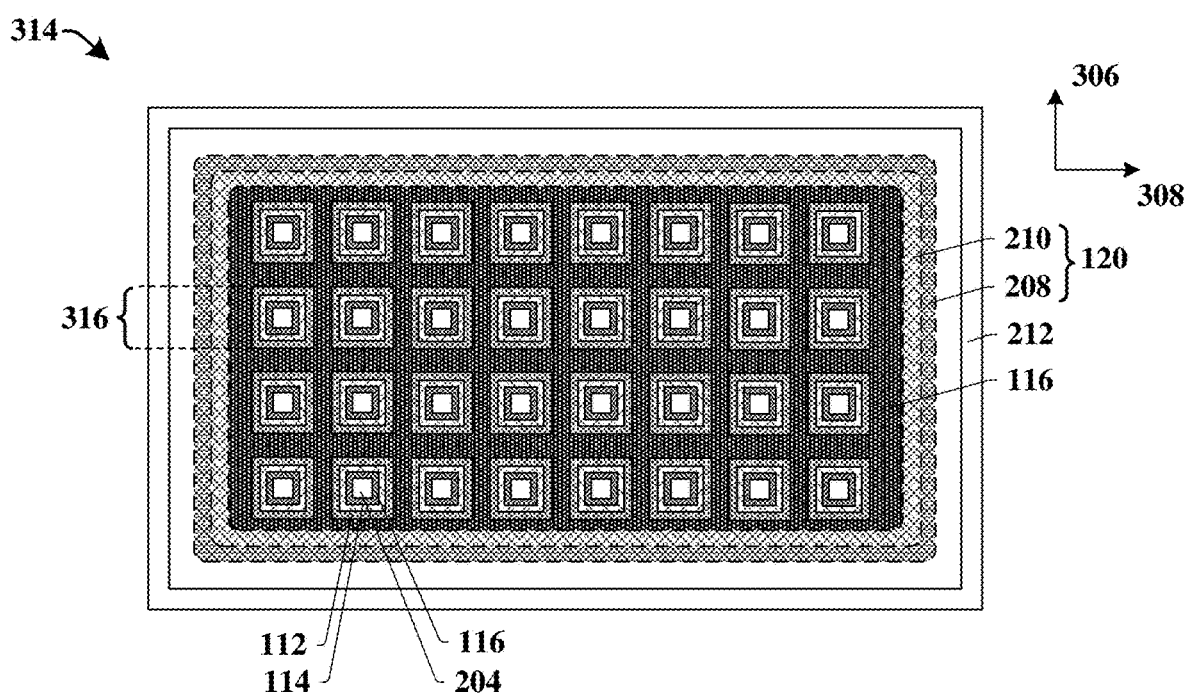

It will be appreciated that in various embodiments, a disclosed MIM capacitor structure may have a plurality of protrusions (e.g., 302a-302c of FIG. 3A) defined by different shapes. For example, FIGS. 3C-3D illustrate some embodiments of alternative shapes of the plurality of protrusions within a disclosed MIM capacitor structure. The different shapes of the plurality of protrusions may affect electric field characteristics within the disclosed MIM capacitor structure, thereby affecting performance of the MIM capacitor structure. The shapes of the plurality of protrusions shown in FIGS. 3C-3D are not limiting examples of possible protrusion shapes, and protrusions having other shapes are also believed to fall within the scope of this disclosure.

FIG. 3C illustrates a top-view 310 of some alternative embodiments of an integrated chip having a high density MIM capacitor structure comprising a plurality of protrusions.

As shown in top-view 310, the MIM capacitor structure 111 comprises a plurality of protrusions 312. The plurality of protrusions 312 have a substantially circular shape. In some embodiments, the plurality of protrusions 312 may be arranged in an array. In some such embodiments, a plurality of protrusions 312 may be aligned in rows (extending in the first direction 306) and columns (extending in the second direction 308).

FIG. 3D illustrates a top-view 314 of some alternative embodiments of an integrated chip having a high density MIM capacitor structure comprising a plurality of protrusions.

As shown in top-view 314, the MIM capacitor structure 111 comprises a plurality of protrusions 316. The plurality of protrusions 316 have a substantially square shape. In some embodiments, the plurality of protrusions 316 may be arranged in an array. In some such embodiments, a plurality of protrusions 316 may be aligned in rows (extending in the first direction 306) and columns (extending in the second direction 308).

Figure 4:
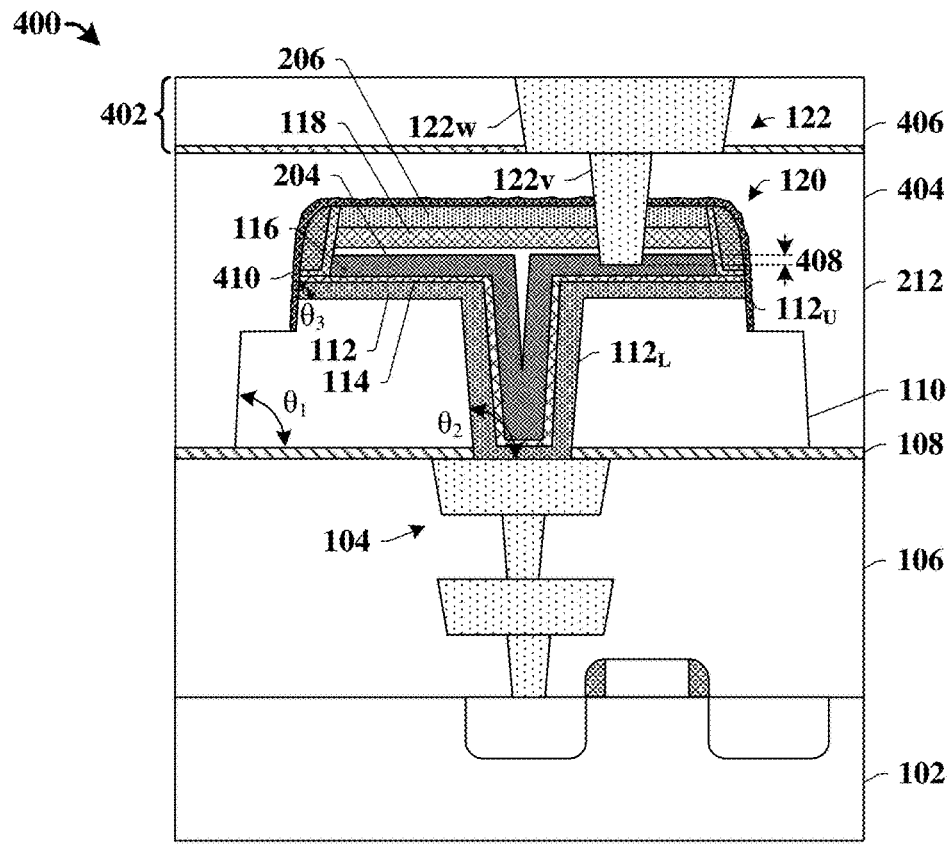
FIG. 4 illustrates a cross-sectional view of some additional embodiments of an integrated chip having a high density MIM capacitor structure.

FIG. 4 illustrates a cross-sectional view of some additional embodiments of an integrated chip 400 having a high density MIM capacitor structure.

The integrated chip 400 comprises one or more lower interconnects 104 disposed within a lower dielectric structure 106 over a substrate 102. A first etch stop layer 108 is arranged over the lower dielectric structure 106 and a first dielectric layer 110 is arranged over the first etch stop layer 108. A MIM capacitor structure, comprising a lower electrode 112, a capacitor dielectric 114, and an upper electrode 116, is arranged over the first dielectric layer 110. A spacer 120 is arranged along opposing sides of the upper electrode 116. In some embodiments, the spacer 120 may have a curved upper surface. In some embodiments, a capping structure 118 is disposed over the upper electrode 116 and a masking layer 206 is over the capping structure 118. A second dielectric layer 212 is disposed over the MIM capacitor structure. In some embodiments, the second dielectric layer 212 may extend over an upper surface of the spacer 120 and over a top surface of the masking layer 206.

In some embodiments, the first dielectric layer 110 has sidewalls that are angled at a first angle $\theta_1$. The first angle $\theta_1$ is an acute angle as measured through the first dielectric layer 110 and with respect to a lower surface of the first dielectric layer 110 facing the substrate 102. The lower electrode 112 has a lower sidewall $112_L$ extending through the first dielectric layer 110 and an upper sidewall $112_U$ overlying the first dielectric layer 110. The lower sidewall $112_L$ is angled at a second angle $\theta_2$, while the upper sidewall $112_U$ is angled at a third angle $\theta_3$. The second angle $\theta_2$ is an obtuse angle as measured through the lower electrode 112 and with respect to a lower surface of the lower electrode 112 facing the substrate 102. The third angle $\theta_3$ is an acute angle as measured through the lower electrode 112 and with respect to a lower surface of the lower electrode 112 facing the substrate 102. In some embodiments, the capacitor dielectric 114, the upper electrode 116, and the capping structure 118 may also have angled sidewalls as shown in FIG. 4.

In some embodiments, an upper dielectric structure 402 is disposed over the first dielectric layer 110 and the second dielectric layer 212. In some embodiments, the upper dielectric structure 402 may comprise an upper etch stop layer 404 and an upper inter-level dielectric (ILD) layer 406. In some embodiments, an upper interconnect structure 122 extends through the upper dielectric structure 402, the masking layer 206, the capping structure 118, and the dielectric 204 to contact the upper electrode 116. In some embodiments, the upper interconnect structure 122 may comprise an upper interconnect via $122v$ and an upper interconnect wire $122w$ over the upper interconnect via $122v$. In some embodiments, the upper interconnect structure 122 may extend to a non-zero distance 408 below a top surface of the upper electrode 116.

In some embodiments, one or more conductive byproducts 410 (e.g., metal byproducts) may be arranged along sidewalls of the lower electrode 112, the capacitor dielectric 114, and/or the spacer 120. The one or more conductive byproducts 410 result from a re-deposition of material etched away from a lower electrode layer during formation of the lower electrode 112. Because the one or more conductive byproducts 410 are separated from the upper electrode 116 by the spacer 120, the conductive byproducts are not able to form a conductive path between the lower electrode 112 and the upper electrode 116, thereby preventing electrical shorting between the lower electrode 112 and the upper electrode 116. In some additional embodiments (not shown), one or more additional conductive byproducts may be disposed along sidewalls of the upper electrode 116. The one or more additional conductive byproducts may result from etching of an upper electrode layer to define the upper electrode 116 and may be covered by the spacer 120, so that the one or more additional conductive byproducts are separated from the one or more conductive byproducts 410 by the spacer 120.

Figure 5A:
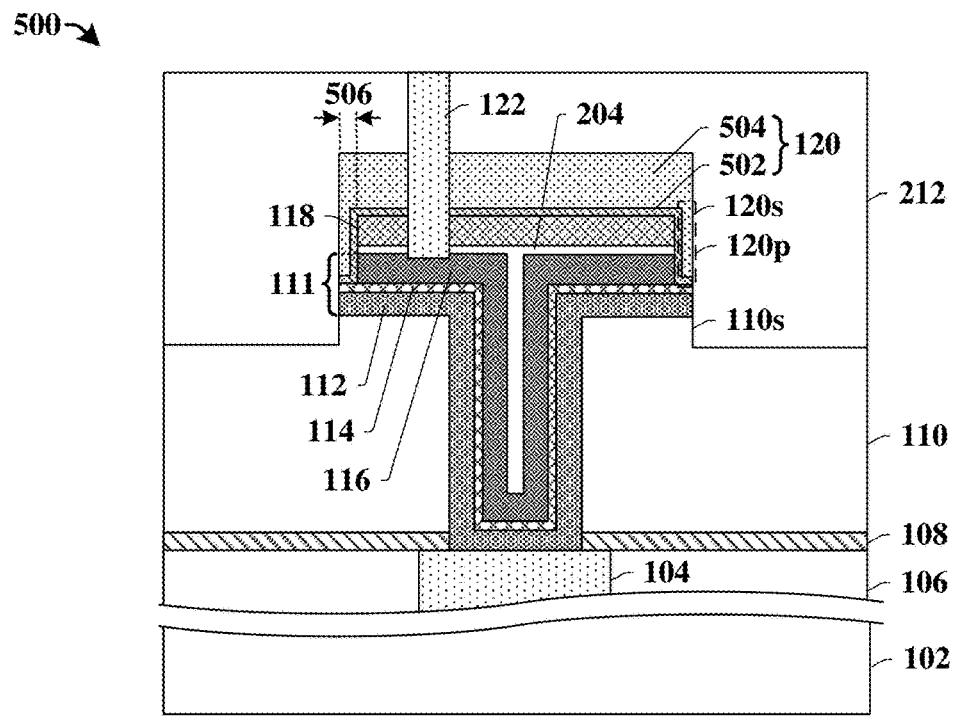
FIGS. 5A-5C illustrate cross-sectional views of some additional embodiments of integrated chips having a high density MIM capacitor structure.

FIG. 5A illustrates a cross-sectional view of some additional embodiments of an integrated chip 500 having a high density MIM capacitor structure.

The integrated chip 500 comprises a MIM capacitor structure 111 arranged over one or more lower interconnects 104 disposed within a lower dielectric structure 106 over a substrate 102. A capping structure 118 is arranged over the MIM capacitor structure 111. The capping structure 118 may be separated from the upper electrode 116 by way of a dielectric 204. A spacer 120 is arranged over the capping structure 118 and the capacitor dielectric 114. In some embodiments, the spacer 120 may extend from directly over the upper electrode 116 and the capping structure 118 to laterally past opposing outermost sidewalls of the upper electrode 116 and the capping structure 118. In some embodiments, the spacer 120 may extend a non-zero distance 506 past one or more of the opposing outermost sidewalls of the upper electrode 116 and the capping structure 118. In some embodiments, the non-zero distance 506 may be in a range of between approximately 50 Å and approximately 750 Å.

In some embodiments, the spacer 120 extends from directly over the capping structure 118 to along a sidewall of the capping structure 118. In such embodiments, the spacer 120 comprises a protrusion 120p that extends outward from a lower surface of the spacer 120 that directly overlies the capping structure 118. In some embodiments, the spacer 120 may comprise an outermost surface 120s that is substantially aligned with outermost sidewalls of the capacitor dielectric 114 and the lower electrode 112. In some embodiments, the outermost surface 120s may also be aligned with a sidewall of the first dielectric layer 110. The outermost surface 120s continuously extends from a bottom of the spacer 120 to a top and/or a topmost surface of the spacer 120. In some embodiments, the outermost surface 120s of the spacer 120 is substantially flat.

In some embodiments, the spacer 120 may comprise a first dielectric 502 and a second dielectric 504 that is a different dielectric material than the first dielectric 502. In some embodiments, the first dielectric 502 lines sidewalls of the capping structure 118 and the upper electrode 116 and horizontally extending surfaces of the capping structure 118 and the capacitor dielectric 114. In some embodiments, the second dielectric 504 lines sidewalls and horizontally extending surfaces of the first dielectric 502. In some embodiments, the first dielectric 502 and the second dielectric 504 may completely cover uppermost surfaces of the capping structure 118 and the capacitor dielectric 114. In some such embodiments, the second dielectric 504 may continuously extend from a first outermost sidewall that is aligned with a first outermost sidewall of the capacitor dielectric 114 to a second outermost sidewall that is aligned with an opposing second outermost sidewall of the capacitor dielectric 114.

Figure 5B:
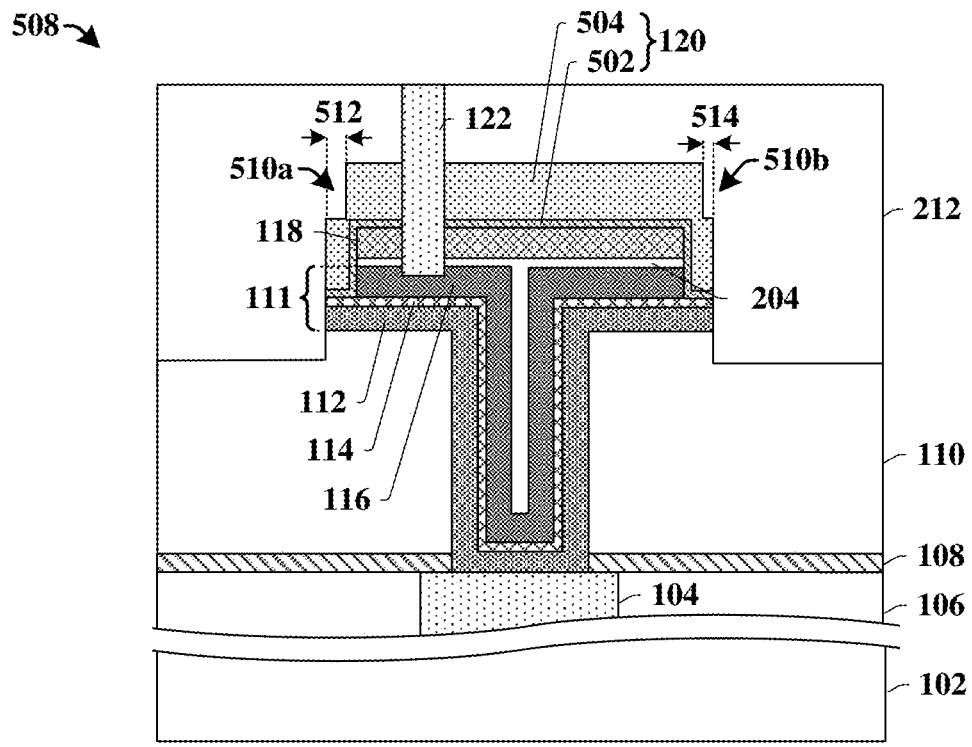

FIG. 5B illustrates a cross-sectional view of some additional embodiments of an integrated chip 508 having a high density MIM capacitor structure.

The integrated chip 508 comprises a MIM capacitor structure 111 arranged over a substrate 102. A capping structure 118 is arranged over the MIM capacitor structure 111. A spacer 120 is arranged over the capping structure 118 and a capacitor dielectric 114 of the MIM capacitor structure 111. In some embodiments, the spacer 120 may extend past outermost sidewalls of the upper electrode 116 and the capping structure 118.

The spacer 120 comprises surfaces defining one or more cavities 510a-510b arranged along one or more outer sidewalls of the spacer 120. The one or more cavities 510a-510b may vertically extend from a top of the spacer 120 to above a bottom of the capping structure 118. In some embodiments, the one or more cavities 510a-510b may comprise a first cavity 510a and a second cavity 510b arranged along opposing sides of the spacer 120. In some embodiments, the first cavity 510a may be laterally recessed a first distance 512 from a first outer sidewall of the spacer 120 and the second cavity 510b may be laterally recessed a second distance 514 from a second outer sidewall of the spacer 120. In some embodiments, the first distance 512 may be approximately equal to the second distance 514. In other embodiments, the first distance 512 may be less than to the second distance 514

Figure 5C:
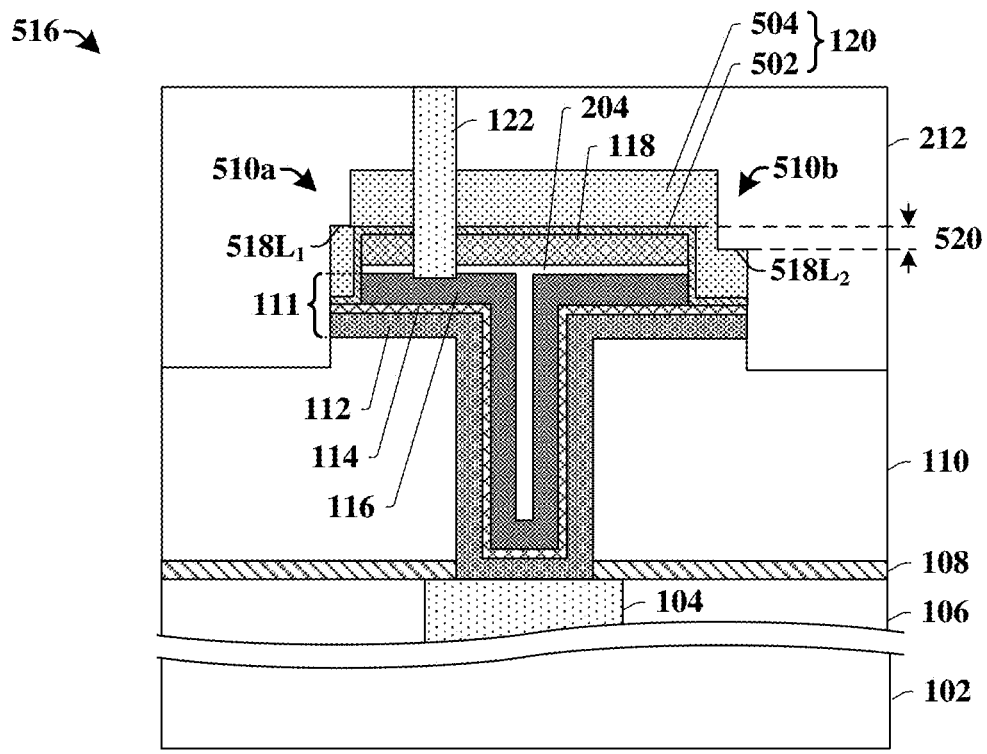

FIG. 5C illustrates a cross-sectional view of some additional embodiments of an integrated chip 516 having a high density MIM capacitor structure.

The integrated chip 516 comprises a spacer 120 having surfaces defining one or more cavities 510a-510b arranged along one or more outer sidewalls of the spacer 120. In some embodiments, the one or more cavities 510a-510b may comprise a first cavity 510a and a second cavity 510b arranged along opposing sides of the spacer 120. In some embodiments, the first cavity 510a may be vertically recessed a first distance 512 from a top of the spacer 120 and the second cavity may be vertically recessed a second distance from the top of the spacer 120. In some embodiments, the first distance may be different than the second distance. In such embodiments, a first lower surface $518L_1$ defining the first cavity 510a is vertically offset from a second lower surface $518L_2$ defining the second cavity 510b by a non-zero distance 520.

Figure 6:
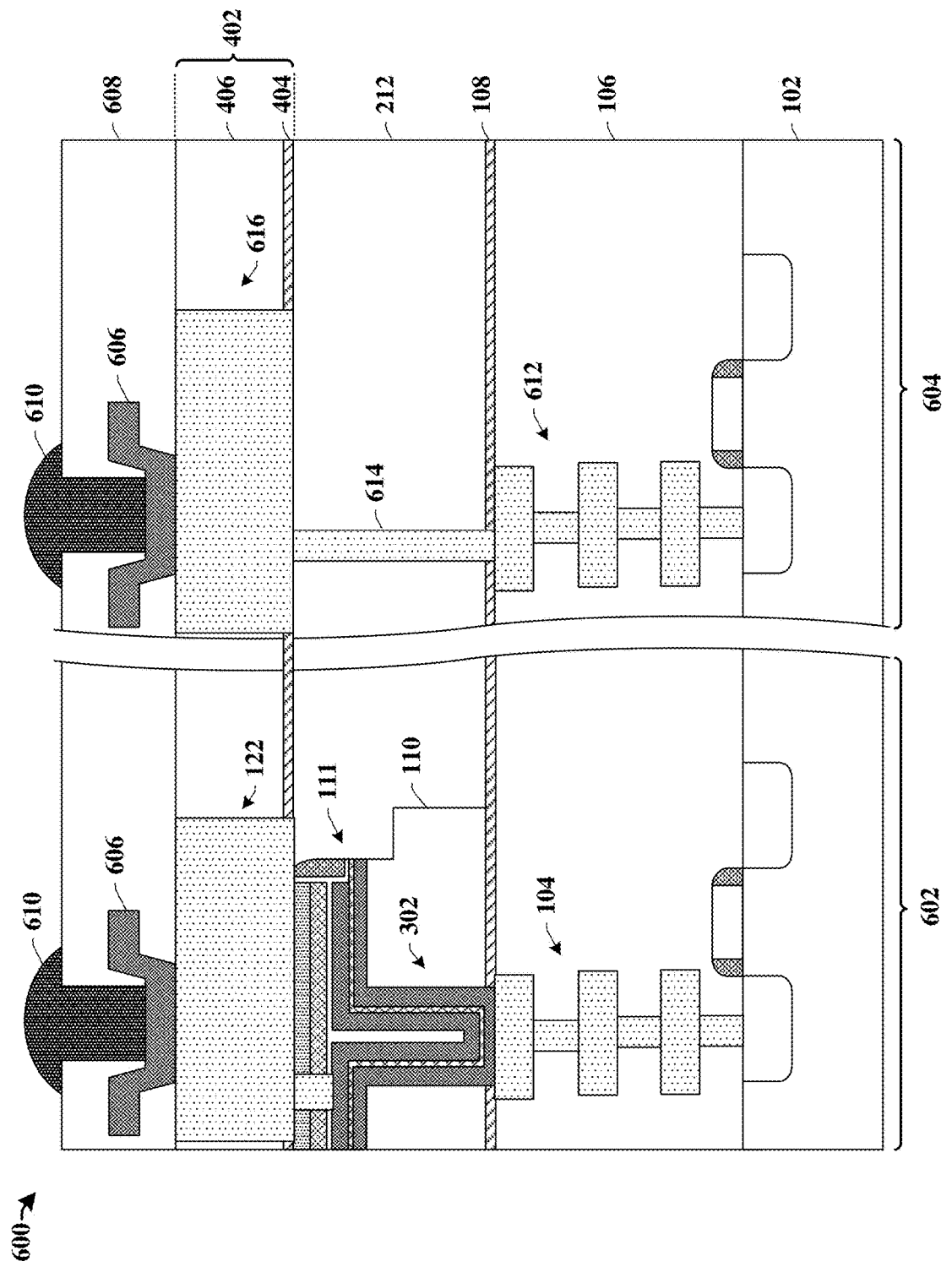
FIG. 6 illustrates a cross-sectional view of some additional embodiments of an integrated chip having a high density MIM capacitor structure.

FIG. 6 illustrates a cross-sectional view of some additional embodiments of an integrated chip 600 having a high density MIM capacitor structure.

The integrated chip 600 comprises a first region 602 and a second region 604 that is laterally offset from the first region 602. Within the first region 602, one or more lower interconnects 104 are arranged within a lower dielectric structure 106 over a substrate 102. A MIM capacitor structure 111 is arranged over both a first etch stop layer 108 and a first dielectric layer 110 that are over the lower dielectric structure 106. The MIM capacitor structure 111 comprises one or more protrusions 302 that extend through the first dielectric layer 110 to contact the one or more lower interconnects 104.

A second dielectric layer 212 is arranged along sidewalls of the first dielectric layer 110 and over upper surfaces of the first dielectric layer 110 and the first etch stop layer 108. In some embodiments, the spacer 120 may have a flat upper surface that is substantially co-planar with an upper surface of the second dielectric layer 212 and/or a masking layer 206 (e.g., planar within a tolerance of a chemical mechanical planarization (CMP) process). An upper dielectric structure 402 is disposed over the first dielectric layer 110 and the second dielectric layer 212. An upper interconnect structure 122 is arranged within the upper dielectric structure 402 and vertically extends through the masking layer 206 to electrically couple to the MIM capacitor structure 111.

Within the second region 604, one or more additional lower interconnects 612 are disposed within the lower dielectric structure 106. The one or more additional lower interconnects 612 are coupled to an additional interconnect via 614 disposed within the second dielectric layer 212. The additional interconnect via 614 is laterally separated from the MIM capacitor structure 111 by way of the first dielectric layer 110 and/or the second dielectric layer 212. An additional upper interconnect structure 616 is disposed within the upper dielectric structure 402 and is coupled to the additional interconnect via 614.

In some embodiments, the upper interconnect structure 122 and the additional upper interconnect structure 616 may be disposed within a topmost inter-level dielectric (ILD) layer and/or a topmost interconnect layer. In such embodiments, the upper interconnect structure 122 and/or the additional upper interconnect structure 616 are connected to a bond pad 606 disposed within a passivation layer 608. In some embodiments, the bond pad 606 may be further coupled to an external bonding structure 610 (e.g., a solder bump, a micro-bump, or the like). Placement of the MIM capacitor structure 111 onto an interconnect layer immediately underlying the topmost ILD layer and/or the topmost interconnect layer provides the MIM capacitor structure 111 with a relatively large height (e.g., since a height of an ILD layer and/or interconnect layer generally increases as a distance from the substrate 102 increases). The relatively large height of the MIM capacitor structure 111 further increases a capacitance of the MIM capacitor structure 111 without increasing a footprint of the MIM capacitor structure 111.

FIGS. 7-18 illustrate cross-sectional views of some embodiments of a method of forming an integrated chip having a high density MIM capacitor structure. Although FIGS. 7-18 are described in relation to a method, it will be appreciated that the structures disclosed in FIGS. 7-18 are not limited to such a method, but instead may stand alone as structures independent of the method.

Figure 7:
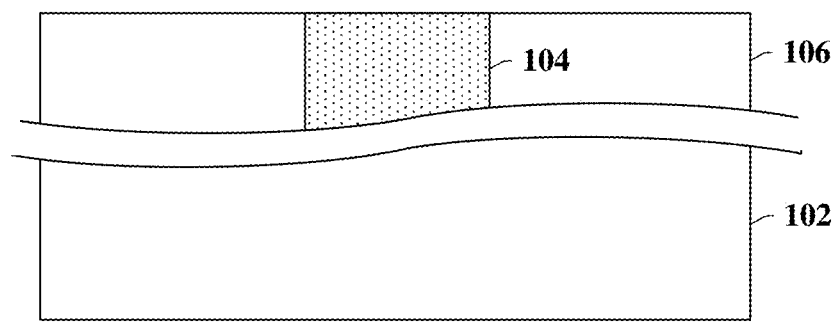
FIGS. 7-17 illustrate cross-sectional views of some embodiments of a method of forming an integrated chip having a high density MIM capacitor structure.

As shown in cross-sectional view 700 of FIG. 7, one or more lower interconnects 104 are formed within a lower dielectric structure 106 formed over a substrate 102. In various embodiments, the substrate 102 may be any type of semiconductor body (e.g., silicon, SiGe, SOI, etc.), such as a semiconductor wafer and/or one or more die on a wafer, as well as any other type of semiconductor and/or epitaxial layers, associated therewith. In some embodiments, the one or more lower interconnects 104 may comprise one or more of a middle-of-line (MOL) interconnect, a conductive contact, an interconnect wire, and/or an interconnect via.

In some embodiments, the one or more lower interconnects 104 may be respectively formed using a damascene process (e.g., a single damascene process or a dual damascene process). In such embodiments, the one or more lower interconnects 104 may be respectively formed by forming an inter-level dielectric (ILD) layer over the substrate 102, selectively etching the ILD layer to define a via hole and/or a trench within the ILD layer, forming a conductive material (e.g., copper, aluminum, etc.) within the via hole and/or the trench, and performing a planarization process (e.g., a chemical mechanical planarization (CMP) process) to remove excess of the conductive material from over the ILD layer.

Figure 8:
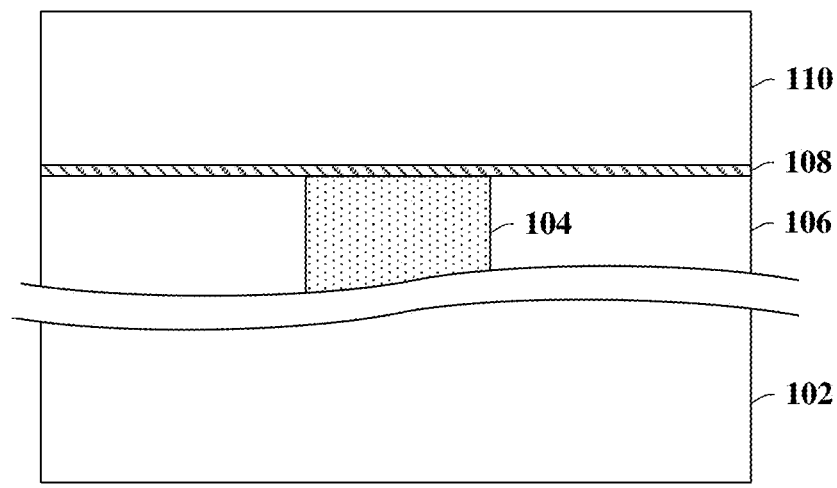

As shown in cross-sectional view 800 of FIG. 8, a first etch stop layer 108 is formed over the lower dielectric structure 106 and a first dielectric layer 110 is formed over the first etch stop layer 108. In some embodiments, the first etch stop layer 108 may comprise a nitride (e.g., silicon nitride), a carbide (e.g., silicon carbide), or the like. In some embodiments, the first dielectric layer 110 may comprise an oxide, a low-k dielectric material, or the like. In various embodiments, the first etch stop layer 108 and/or the first dielectric layer 110 may be formed by one or more deposition processes (e.g., a physical vapor deposition (PVD) process, a chemical vapor deposition (CVD) process, a plasma enhanced CVD (PE-CVD) process, an atomic layer deposition (ALD) process, or the like).

Figure 9A:
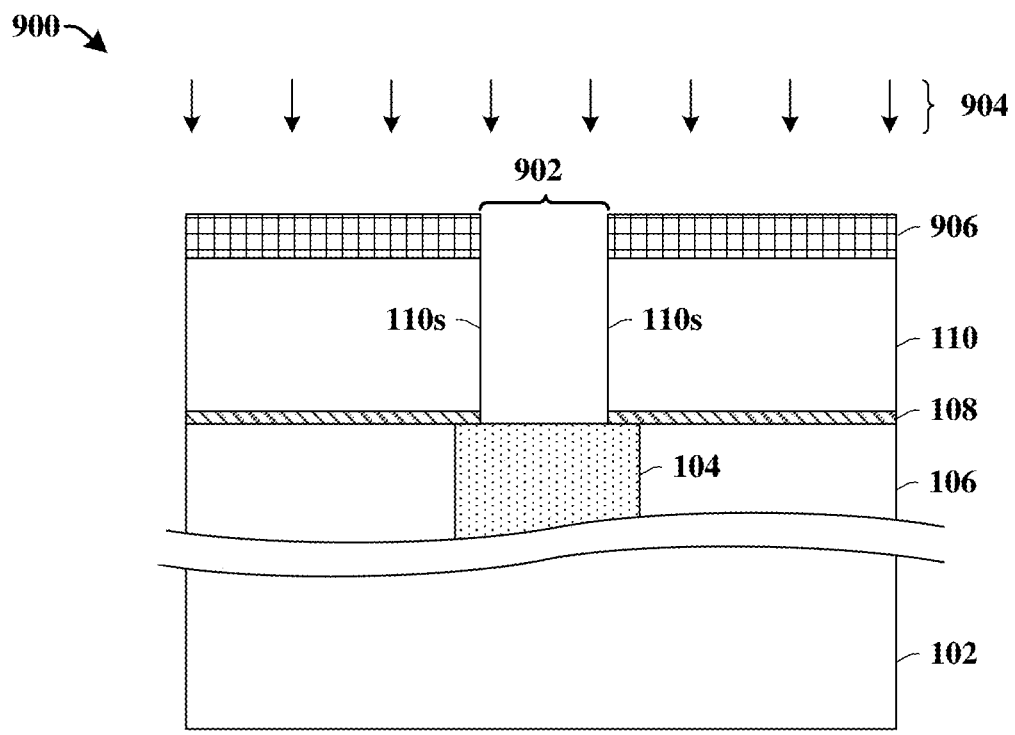
Figure 9B:
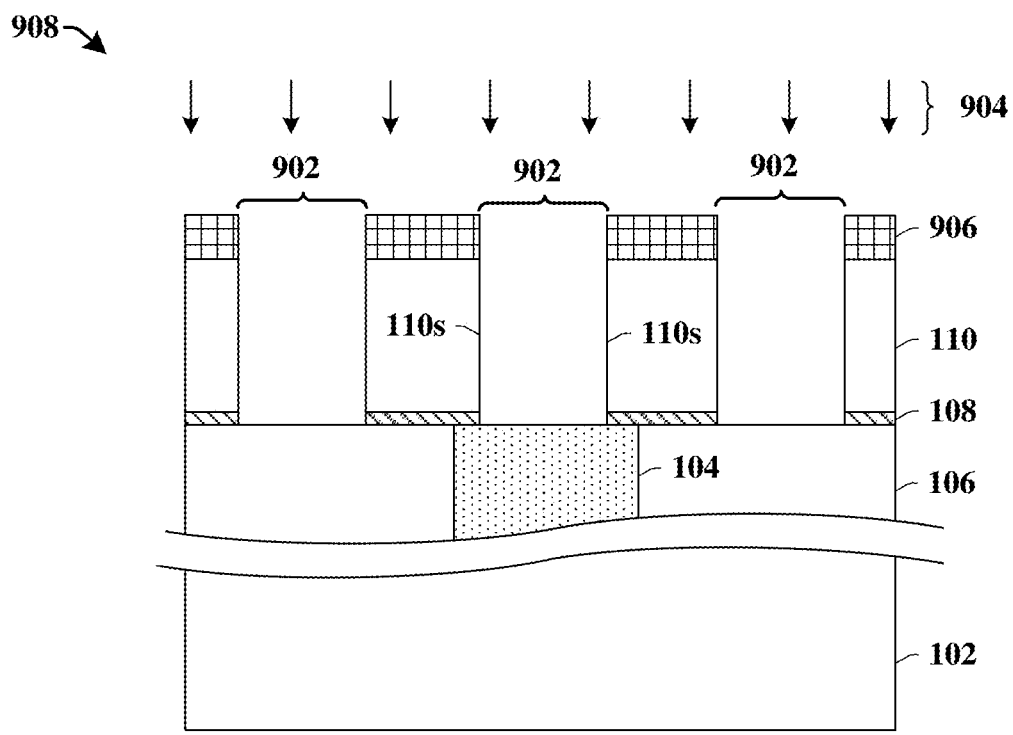

As shown in cross-sectional view 900 of FIG. 9A (taken along a first direction) and cross-sectional view 908 of FIG. 9B (taken along a second direction that is perpendicular to the first direction), a first etching process is performed to pattern the first dielectric layer 110. The first etching process forms one or more sidewalls 110s of the first dielectric layer 110 that define a plurality of openings 902 extending through the first dielectric layer 110. In some embodiments, the plurality of openings 902 may respectively have a substantially rectangular shape as viewed from a top-view. In other embodiments, the plurality of openings 902 may respectively have a substantially circular shape, a substantially square shape, or the like, as viewed from a top-view. In some embodiments, the first etching process may be performed by exposing the first dielectric layer 110 to a first etchant 904 according to a first mask 906. In some embodiments, the first etchant 904 may comprise a dry etchant (e.g., a reactive ion etching (RIE) etchant, a plasma etchant, or the like). In some embodiments, the first etchant 904 may have an etching chemistry comprising one or more of fluorine (F), tetrafluoromethane ($CF_4$), ozone ($O_2$), or octafluorocyclobutane ($C_4F_8$), or the like. In some embodiments, the first mask 906 may comprise a photosensitive material (e.g., photoresist), a hard mask, or the like.

Figure 10:
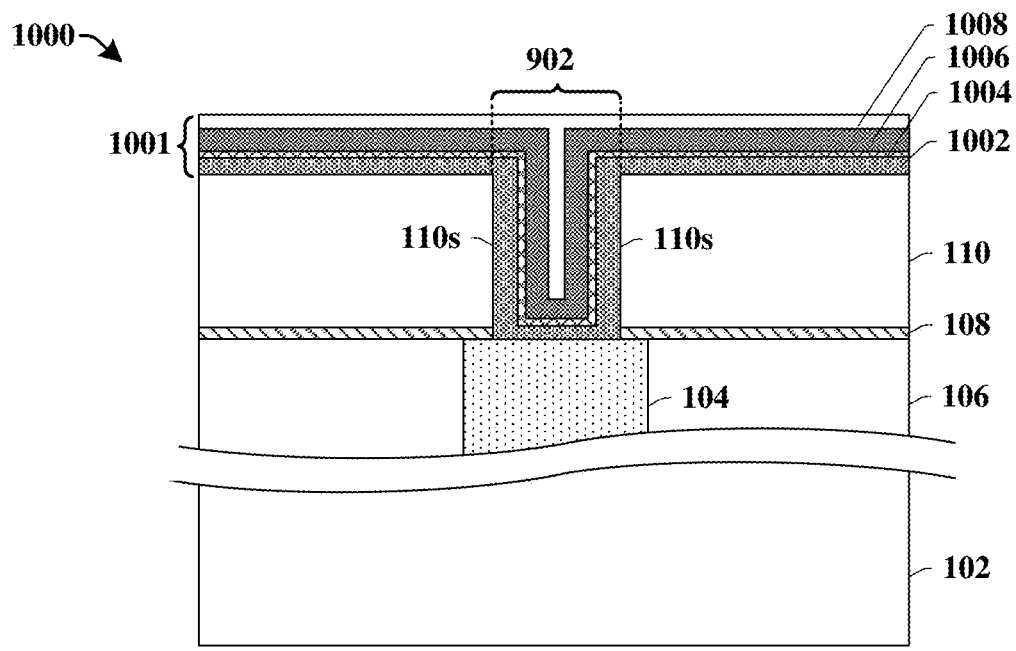

As shown in cross-sectional view 1000 of FIG. 10, a capacitor stack 1001 is formed over the first dielectric layer 110 and within the plurality of openings 902. In some embodiments, the capacitor stack 1001 may be formed by forming a lower electrode layer 1002 along the one or more sidewalls 110s and along an upper surface of the first dielectric layer 110, by forming a capacitor dielectric layer 1004 along sidewalls and an upper surface of the lower electrode layer 1002, by forming an upper electrode layer 1006 along sidewalls and an upper surface of the capacitor dielectric layer 1004, and by forming a dielectric layer 1008 along sidewalls and an upper surface of the upper electrode layer 1006. In some embodiments, the lower electrode layer 1002, the capacitor dielectric layer 1004, the upper electrode layer 1006, and the dielectric layer 1008 may be formed by a plurality of deposition processes (e.g., a PVD process, a CVD process, a PE-CVD process, an ALD process, or the like).

Figure 11:
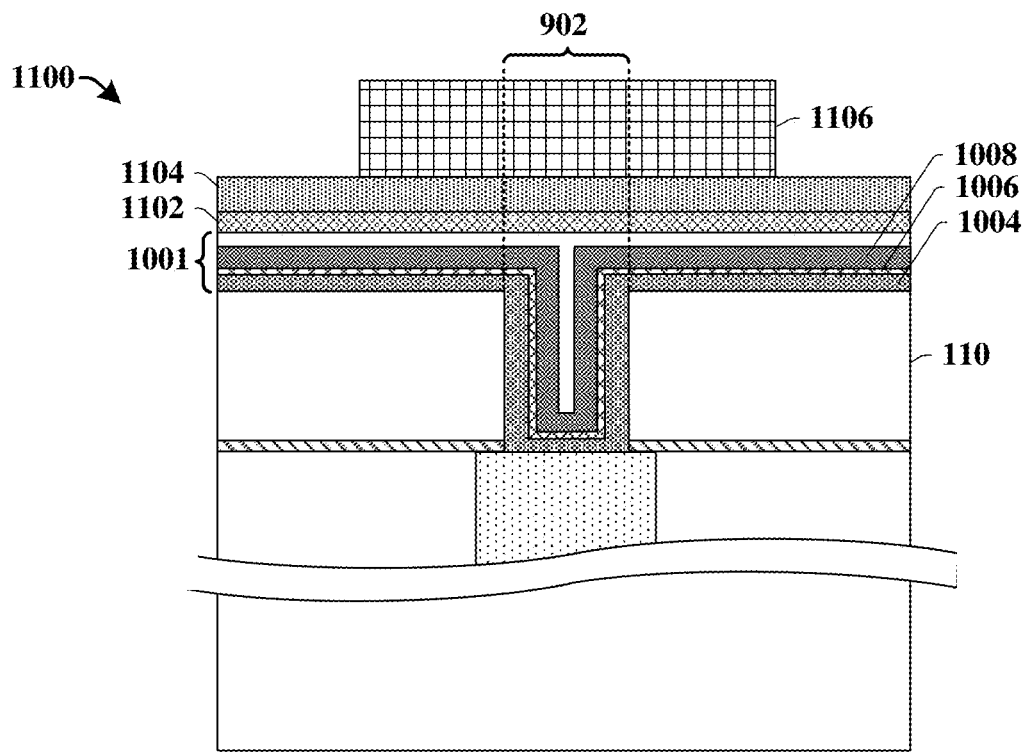

As shown in cross-sectional view 1100 of FIG. 11, one or more capping layers 1102 are formed over the capacitor stack 1001. In some embodiments, the one or more capping layers 1102 may comprise an anti-reflective layer. In some embodiments, a masking layer 1104 is formed over the one or more capping layers 1102. A second mask 1106 is subsequently formed over the one or more capping layers 1102 and/or the masking layer 1104. The second mask 1106 may be formed to directly overlie the plurality of openings 902 within the first dielectric layer 110. In some embodiments, the masking layer 1104 and the one or more capping layers 1102 may respectively comprise a dielectric. For example, in some embodiments the one or more capping layers 1102 may comprise silicon oxynitride, while the masking layer 1104 may comprise silicon nitride. In some embodiments, the second mask 1106 may comprise a photosensitive material (e.g., photoresist), a hard mask, or the like.

Figure 12:
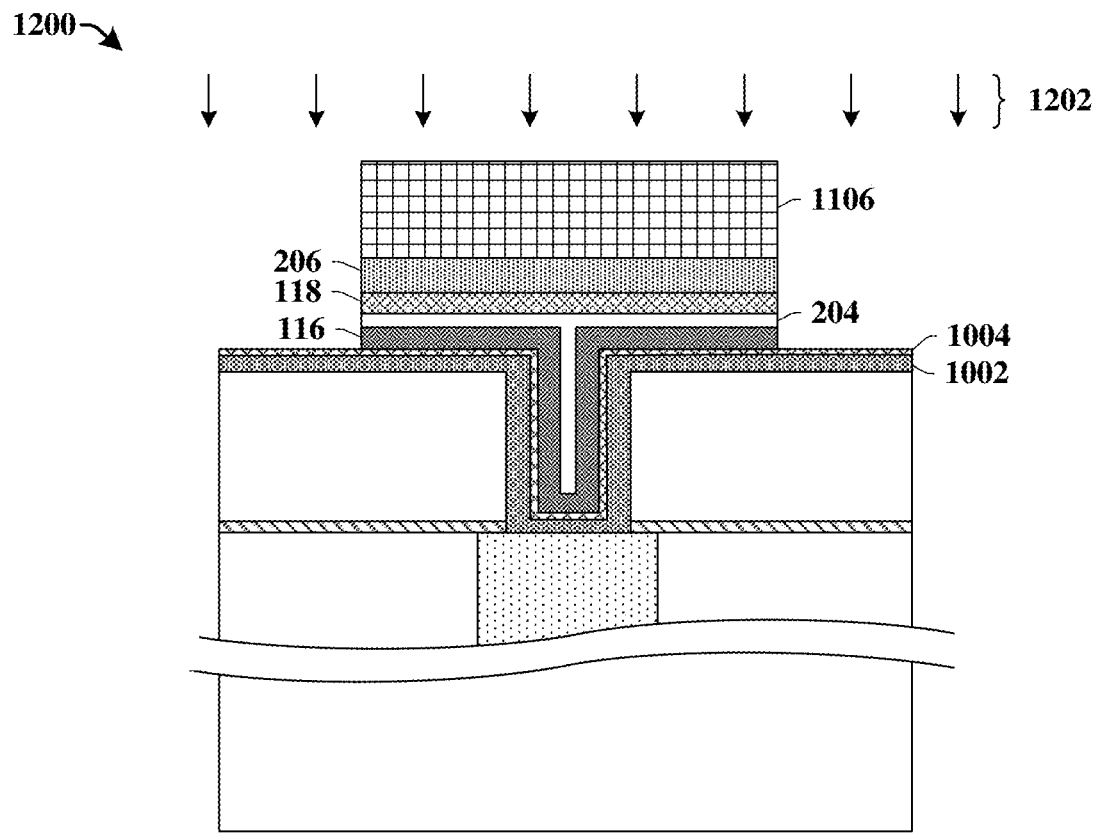

As shown in cross-sectional view 1200 of FIG. 12, a second etching process is performed according to the second mask 1106. The second etching process removes parts of the masking layer (e.g., 1104 of FIG. 11), the one or more capping layers (e.g., 1102 of FIG. 11), the dielectric layer (e.g., 1008 of FIG. 11), and the upper electrode layer (e.g., 1006 of FIG. 11) to define a masking layer 206, a capping structure 118, a dielectric 204, and an upper electrode 116. The second etching process also exposes an upper surface of the capacitor dielectric layer 1004. In some embodiments, the second etching process etches the masking layer, the one or more capping layers, the dielectric layer, and the upper electrode layer to a second etchant 1202 according to the second mask 1106. In some embodiments, the second etchant 1202 may comprise a dry etchant (e.g., a reactive ion etching (RIE) etchant, a plasma etchant, or the like). In some embodiments, the second etchant 1202 may have an etching chemistry comprising one or more tetrafluoromethane ($CF_4$), fluoroform ($CHF_3$), chlorine ($Cl_2$), nitrogen ($N_2$), argon (Ar), boron trichloride ($BCl_3$), or the like.

Figure 13:
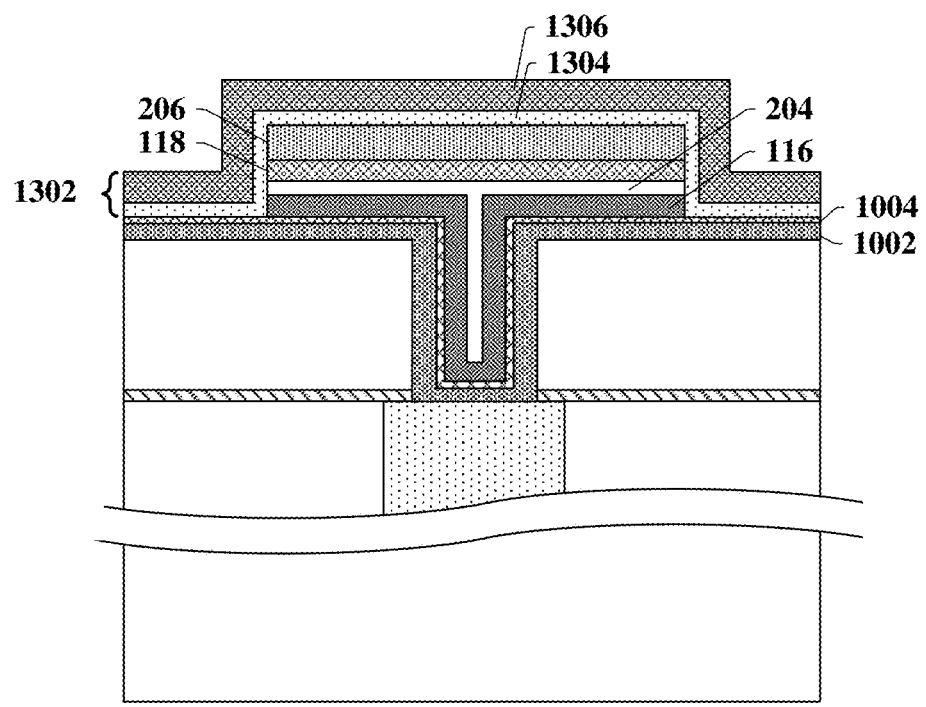

As shown in cross-sectional view 1300 of FIG. 13, a spacer structure 1302 is formed along horizontally extending surfaces of the capping structure 118 and the capacitor dielectric layer 1004 and also along sidewalls of the capping structure 118 and the upper electrode 116. In some embodiments, the spacer structure 1302 comprises a first dielectric layer 1304 and a second dielectric layer 1306 over the first dielectric layer 1304. The first dielectric layer 1304 and the second dielectric layer 1306 continuously extend between outermost sidewalls of the spacer structure 1302. In some embodiments, the spacer structure 1302 may be formed by one or more deposition processes (e.g., a PVD process, a CVD process, a PE-CV process, or the like). In various embodiments, the spacer structure 1302 may comprise silicon nitride, silicon dioxide, silicon oxynitride, and/or the like. In some embodiments, the spacer structure 1302 is formed to a thickness that is in a range of between approximately 100 Å and approximately 1500 Å, between approximately 50 Å and approximately 1000 Å, between approximately 250 Å and approximately 7500 Å, approximately 500 Å, or other similar values.

Figure 14:
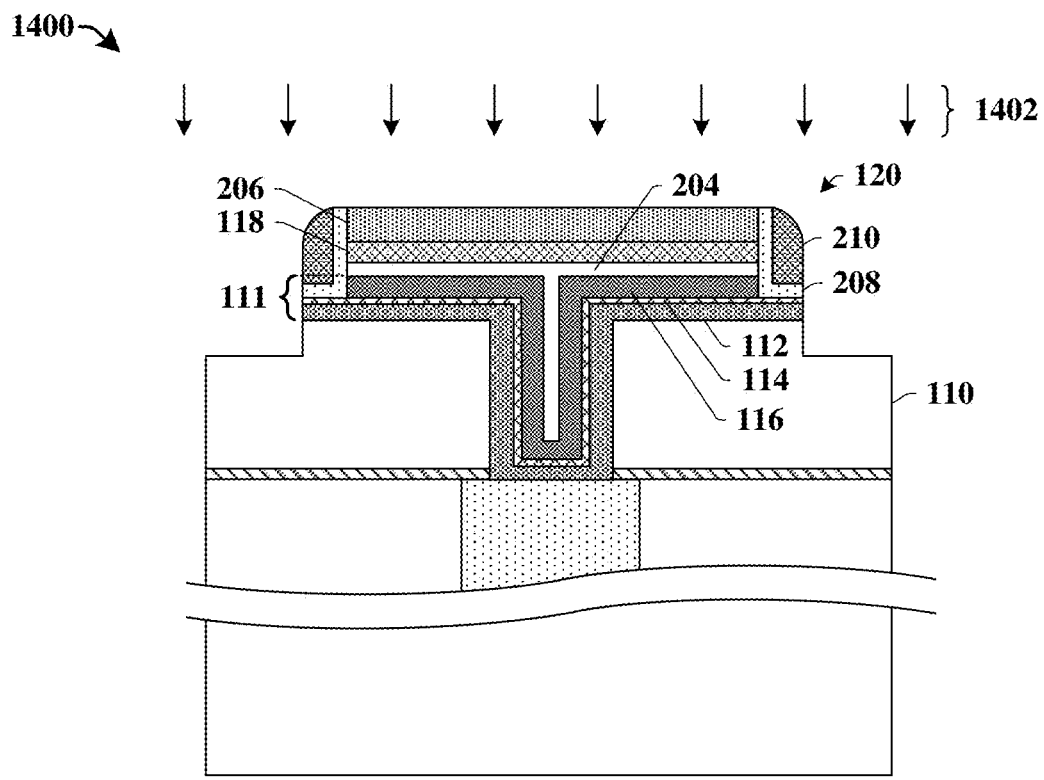

As shown in cross-sectional view 1400 of FIG. 14, the spacer structure (e.g., 1302 of FIG. 13) is exposed to a third etchant 1402 during a third etching process. The third etchant removes the spacer structure (e.g., 1302 of FIG. 13) from horizontally extending surfaces. Removing the spacer structure (e.g., 1302 of FIG. 13) from the horizontally extending surfaces leaves a part of the spacer structure (e.g., 1302 of FIG. 13) along opposing sidewalls the capping structure 118 and the upper electrode 116 as a spacer 120 (e.g., a self-aligned spacer). In some embodiments, the third etchant 1402 may comprise a dry etchant (e.g., a reactive ion etching (RIE) etchant, a plasma etchant, or the like). In some embodiments, the third etchant 1402 may have an etching chemistry comprising one or more tetrafluoromethane ($CF_4$), fluoroform ($CHF_3$), chlorine ($Cl_2$), nitrogen ($N_2$), argon (Ar), boron trichloride ($BCl_3$), or the like.

In some embodiments, parts of the lower electrode layer (e.g., 1002 of FIG. 13) and the capacitor dielectric layer (e.g., 1004 of FIG. 13) are subsequently exposed to a fourth etchant according to the spacer 120 to define a lower electrode 112 and a capacitor dielectric 114 of a MIM capacitor structure 111. In some embodiments, the fourth etchant may be a same etchant as the third etchant 1402 (e.g., as part of a continuous etching process that defines the spacer 120), while in other embodiments the fourth etchant may comprise an etchant that is separate and different than the third etchant 1402. Since the lower electrode layer and the capacitor dielectric layer are etched according to the spacer 120, the spacer 120 has an outermost sidewall that is substantially aligned with outermost sidewalls of the lower electrode 112 and the capacitor dielectric 114.

By using the spacer 120 to define the lower electrode 112 the capacitor dielectric 114, the lower electrode 112 can be formed to have a similar sized footprint as the upper electrode 116. Furthermore, using the spacer 120 to define the lower electrode 112 allows for both the upper electrode 116 and the lower electrode 112 to be formed using a single photomask, thereby providing for a relatively low cost process to form the MIM capacitor structure 111 (e.g., compared to a process that uses separate photomasks to define upper and lower electrodes). Moreover, having the spacer 120 in place during the third etching process allows for the spacer 120 to cover sidewalls of the upper electrode 116 and to prevent conductive byproducts (e.g., from etching the lower electrode layer) from being re-deposited along sidewalls of the upper electrode 116. By preventing conductive byproducts from being re-deposited along sidewalls of the upper electrode 116 the conductive byproducts cannot form a conductive path between the lower electrode 112 and the upper electrode 116, thereby preventing electrical shorting between the lower electrode 112 and the upper electrode 116.

Figure 15:
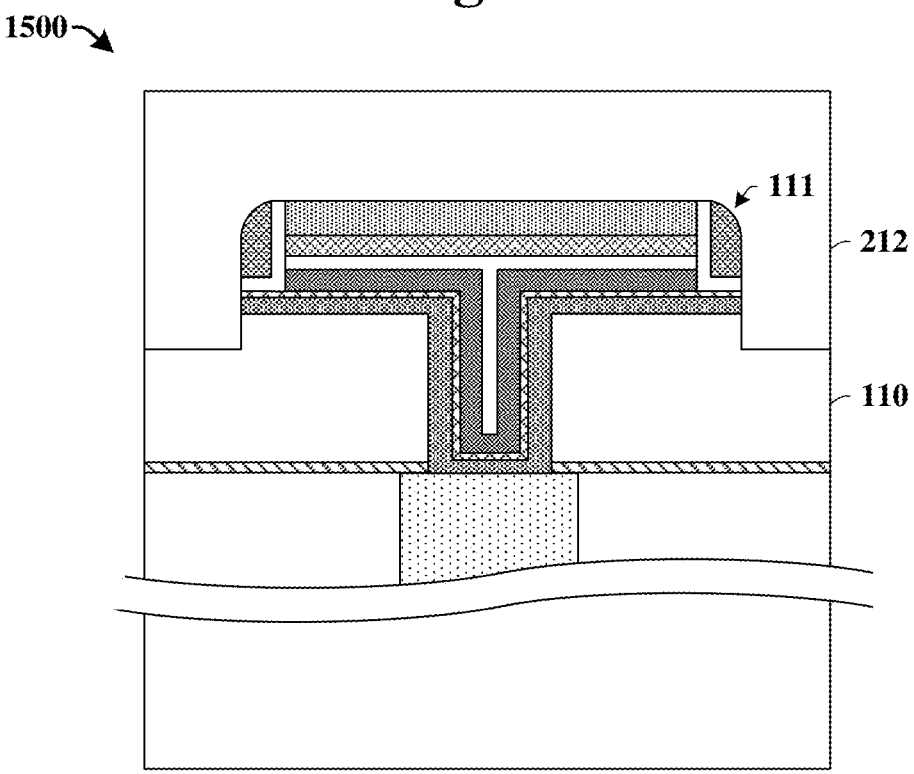

As shown in cross-sectional view 1500 of FIG. 15, a second dielectric layer 212 is formed over the MIM capacitor structure 111 and the first dielectric layer 110. In some embodiments, the second dielectric layer 212 may comprise an oxide, a low-k dielectric material, or the like. The second dielectric layer 212 may be formed by one or more deposition processes (e.g., a PVD process, a CVD process, a PE-CVD process, an ALD process, or the like).

Figure 16:
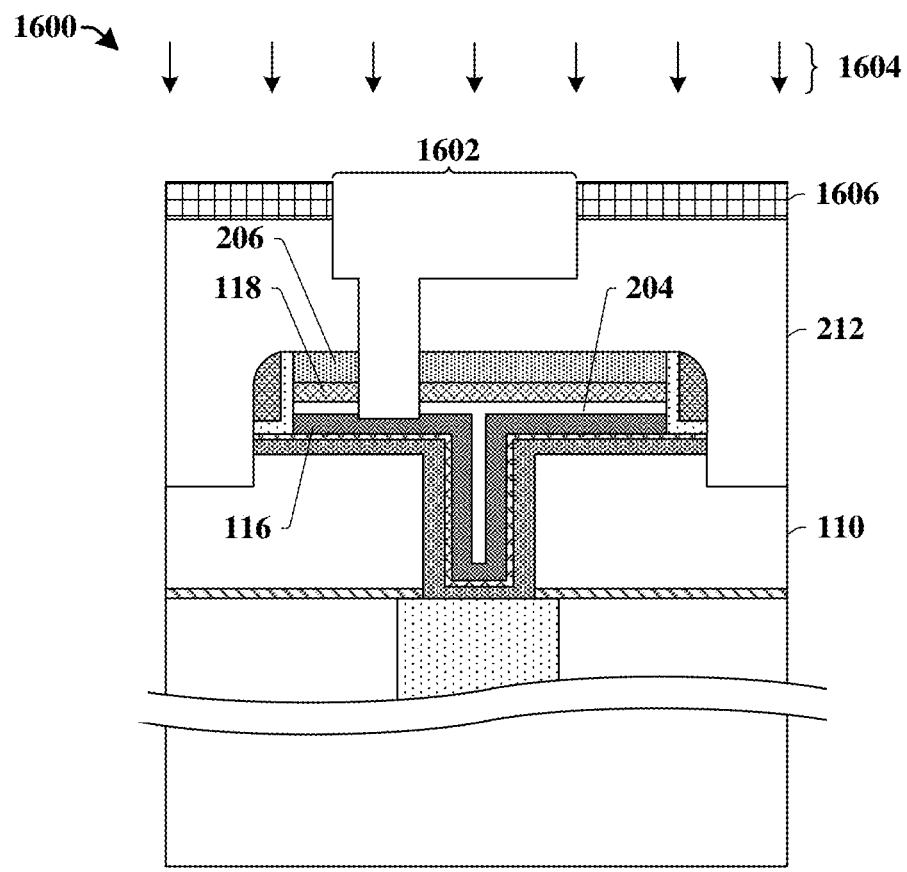

As shown in cross-sectional view 1600 of FIG. 16, a fifth etching process is subsequently performed to form one or more upper interconnect openings 1602 within the second dielectric layer 212. The one or more upper interconnect openings 1602 extend through the second dielectric layer 212, the masking layer 206, the capping structure 118, and the dielectric 204 to expose an upper surface of the upper electrode 116. In some embodiments, the fifth etching process may be performed by exposing the second dielectric layer 212 to a fifth etchant 1604 according to a third mask 1606. In some embodiments, the fifth etchant 1604 may comprise a plasma etchant having an etching chemistry comprising one or more of fluorine (F), tetrafluoromethane ($CF_4$), ozone ($O_2$), or octafluorocyclobutane ($C_4F_8$), or the like. In some embodiments, the third mask 1606 may comprise a photosensitive material (e.g., photoresist), a hard mask, or the like.

Figure 17:
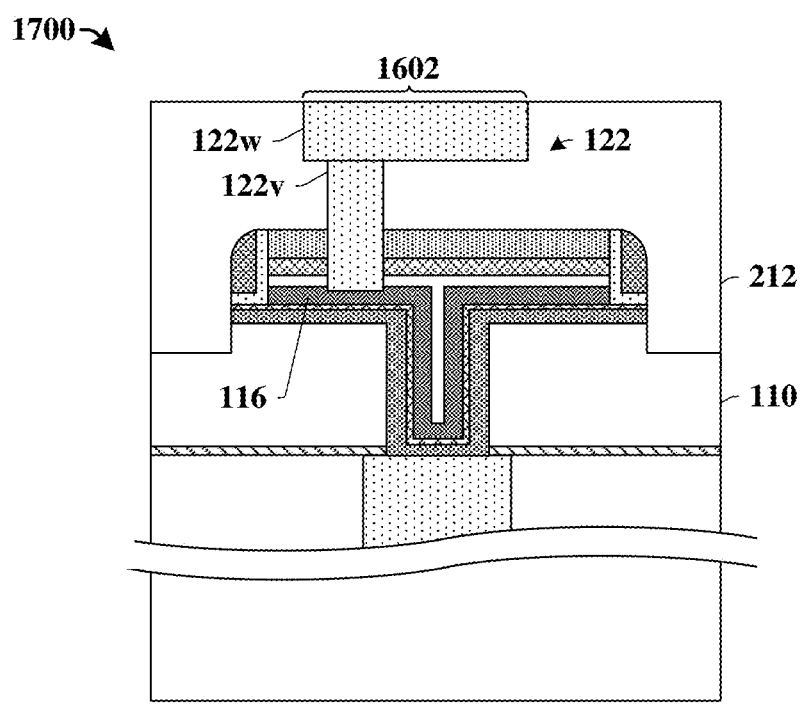

As shown in cross-sectional view 1700 of FIG. 17, an upper interconnect structure 122 is formed within the second dielectric layer 212. In some embodiments, the upper interconnect structure 122 may be formed by forming a conductive material within the one or more upper interconnect openings 1602 etched into the second dielectric layer 212. In some embodiments, the conductive material may be formed by way of a deposition process and/or a plating process (e.g., electroplating, electro-less plating, etc.). In various embodiments, the conductive material may comprise copper, aluminum, or the like. After forming the conductive material within the upper interconnect opening 1602, a planarization process may be performed to remove excess of the conductive material from over the second dielectric layer 212 and to define an upper interconnect structure 122. In some embodiments, the upper interconnect structure 122 may comprise an upper interconnect via 122v and an upper interconnect wire 122w.

Figure 18:
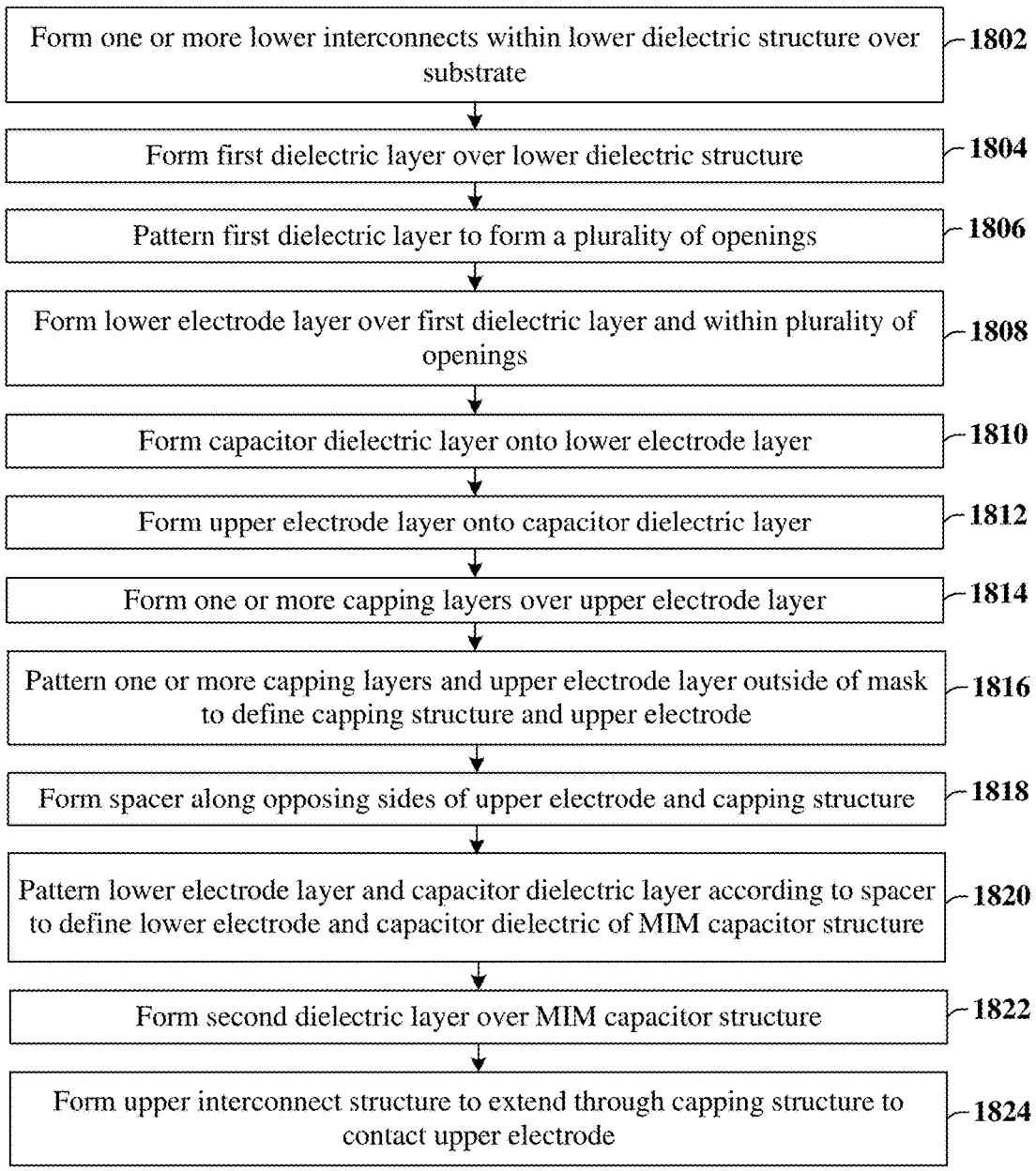
FIG. 18 illustrates a flow diagram of some embodiments of a method of forming an integrated chip having a high density MIM capacitor structure.

FIG. 18 illustrates a flow diagram of some embodiments of a method 1800 of forming an integrated chip having a high density MIM capacitor structure.

While the methods (e.g., methods 1800 and 3000) is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1802, one or more lower interconnects are formed within a lower dielectric structure over a substrate. FIG. 7 illustrates a cross-sectional view 700 of some embodiments corresponding to act 1802.

At act 1804, a first dielectric layer is formed over the lower dielectric structure. FIG. 8 illustrates a cross-sectional view 800 of some embodiments corresponding to act 1804.

At act 1806, the first dielectric layer is patterned to form a plurality of openings. FIGS. 9A-9B illustrate cross-sectional views, 900 and 908, of some embodiments corresponding to act 1806.

At act 1808, a lower electrode layer is formed over the first dielectric layer and within the plurality of openings. FIG. 10 illustrates a cross-sectional view 1000 of some embodiments corresponding to act 1808.

At act 1810, a capacitor dielectric layer is formed onto the lower electrode layer. FIG. 10 illustrates a cross-sectional view 1000 of some embodiments corresponding to act 1810.

At act 1812, an upper electrode layer is formed onto the capacitor dielectric layer. FIG. 10 illustrates a cross-sectional view 1000 of some embodiments corresponding to act 1812.

At act 1814, one or more capping layers are formed over the upper electrode layer. FIG. 11 illustrates a cross-sectional view 1100 of some embodiments corresponding to act 1814.

At act 1816, the one or more capping layers and the upper electrode layer are patterned outside of a mask to define a capping structure and an upper electrode. FIGS. 11-12 illustrate cross-sectional views 1100-1200 of some embodiments corresponding to act 1816.

At act 1818, a spacer (e.g., a self-aligned spacer) is formed along opposing sides of the upper electrode and the capping structure. FIGS. 13-14 illustrate cross-sectional views 1300-1400 of some embodiments corresponding to act 1818.

At act 1820, the lower electrode layer and the capacitor dielectric layer are patterned according to the spacer to define a lower electrode and a capacitor dielectric of a MIM capacitor structure. FIG. 14 illustrates a cross-sectional view 1400 of some embodiments corresponding to act 1820.

At act 1822, a second dielectric layer is formed over the MIM capacitor structure. FIG. 15 illustrates a cross-sectional view 1500 of some embodiments corresponding to act 1822.

At act 1824, an upper interconnect structure is formed to extend through the capping structure to contact the upper electrode. FIGS. 16-17 illustrate cross-sectional views 1600-1700 of some embodiments corresponding to act 1824.

FIGS. 19-29 illustrate cross-sectional views 1900-2900 of some alternative embodiments of a method of forming an integrated chip having a high density MIM capacitor structure. Although FIGS. 19-29 are described in relation to a method, it will be appreciated that the structures disclosed in FIGS. 19-29 are not limited to such a method, but instead may stand alone as structures independent of the method.

Figure 19:
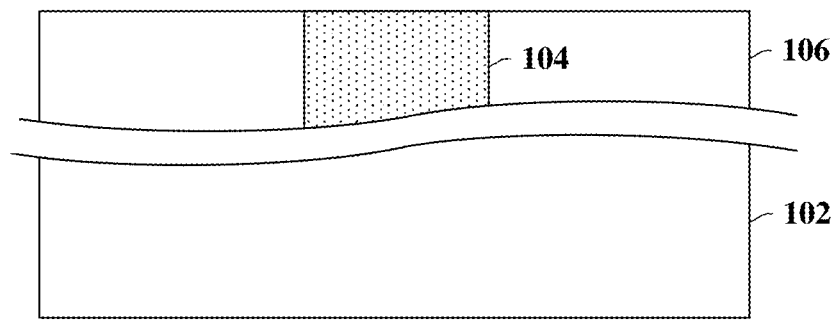
FIGS. 19-29 illustrate cross-sectional views of some alternative embodiments of a method of forming an integrated chip having a high density MIM capacitor structure.

As shown in cross-sectional view 1900 of FIG. 19, one or more lower interconnects 104 are formed within a lower dielectric structure 106 formed over a substrate 102.

Figure 20:
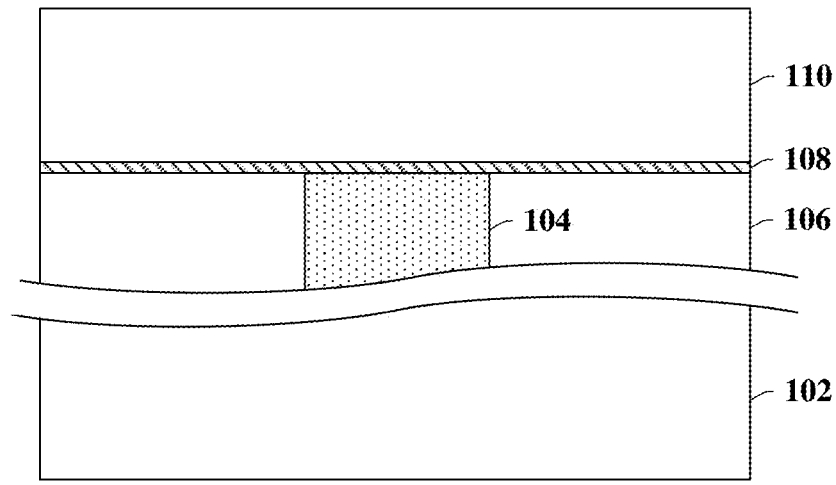

As shown in cross-sectional view 2000 of FIG. 20, a first etch stop layer 108 is formed over the lower dielectric structure 106 and a first dielectric layer 110 is formed over the first etch stop layer 108.

Figure 21A:
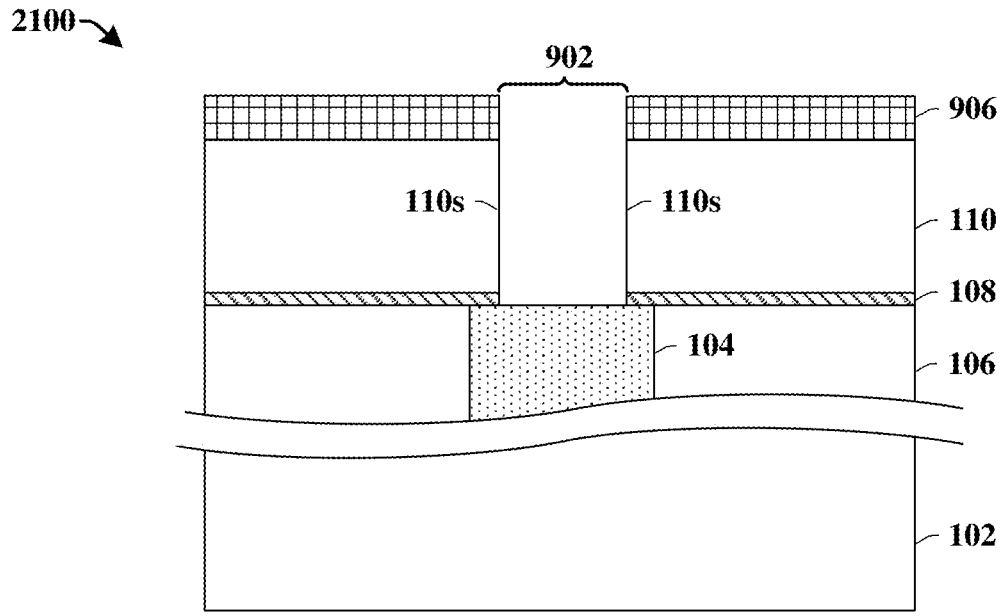
Figure 21B:
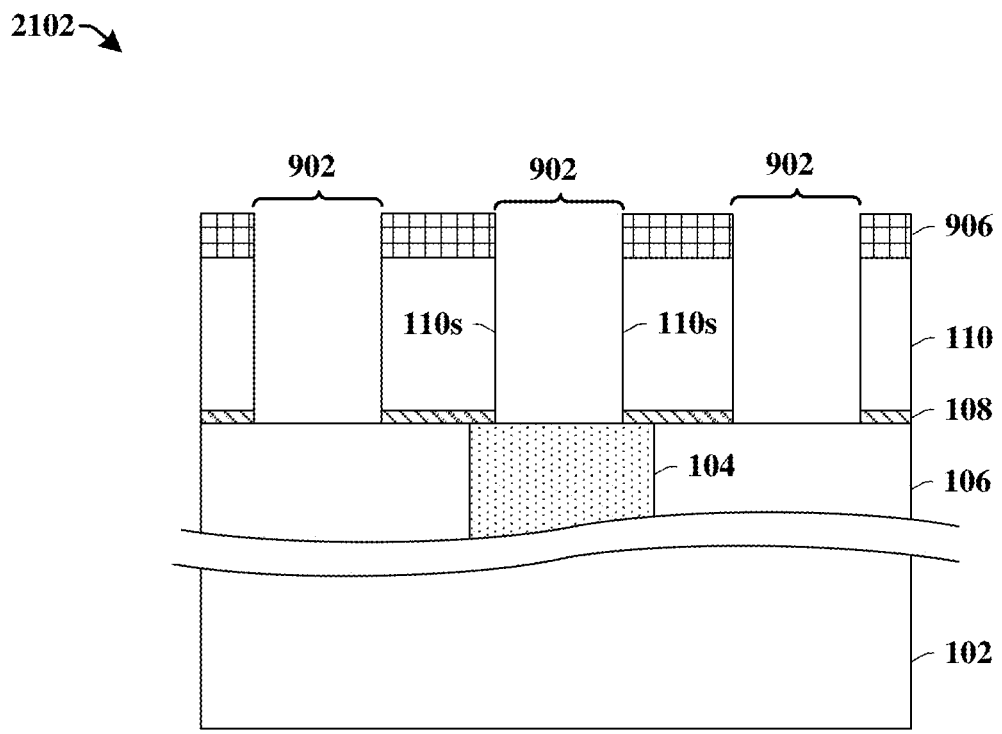

As shown in cross-sectional view 2100 of FIG. 21A (taken along a first direction) and cross-sectional view 2102 of FIG. 21B (taken along a second direction that is perpendicular to the first direction), a first etching process is performed to pattern the first dielectric layer 110. The first etching process forms one or more sidewalls 110s of the first dielectric layer 110 that define a plurality of openings 902 extending through the first dielectric layer 110

Figure 22:
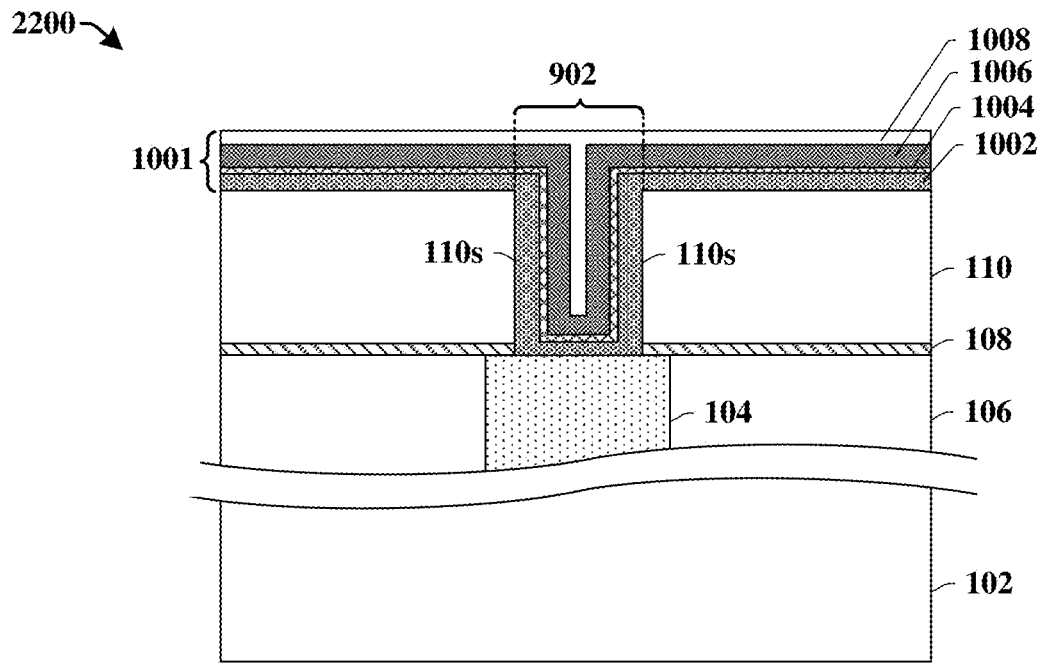

As shown in cross-sectional view 2200 of FIG. 22, a capacitor stack 1001 is formed over the first dielectric layer 110 and within the plurality of openings 902. In some embodiments, the capacitor stack 1001 may be formed by forming a lower electrode layer 1002 along the one or more sidewalls 110s and an upper surface of the first dielectric layer 110, by forming a capacitor dielectric layer 1004 along sidewalls and an upper surface of the lower electrode layer 1002, by forming an upper electrode layer 1006 along sidewalls and an upper surface of the capacitor dielectric layer 1004, and by forming a dielectric layer 1008 along sidewalls and an upper surface of the upper electrode layer 1006.

Figure 23:
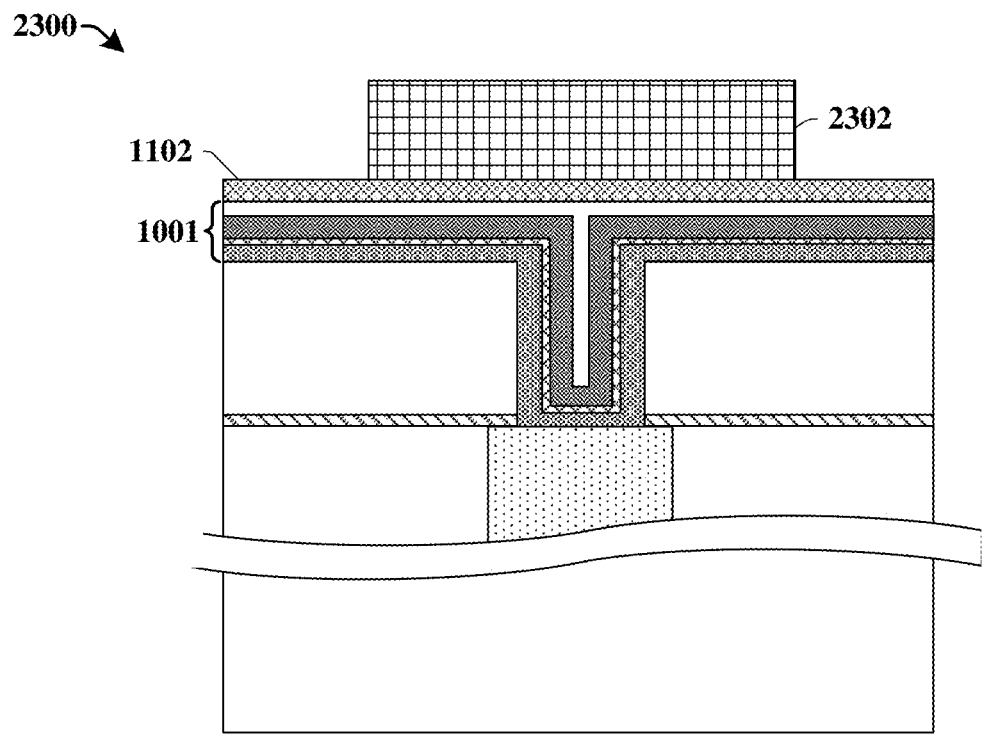

As shown in cross-sectional view 2300 of FIG. 23, one or more capping layers 1102 are formed over the capacitor stack 1001. A second mask 2302 is subsequently formed over the one or more capping layers 1102. The second mask 2302 may be formed to directly overlie the plurality of openings 902 within the first dielectric layer 110. In some embodiments, the second mask 2302 may comprise a photosensitive material (e.g., photoresist), a hard mask, or the like.

Figure 24:
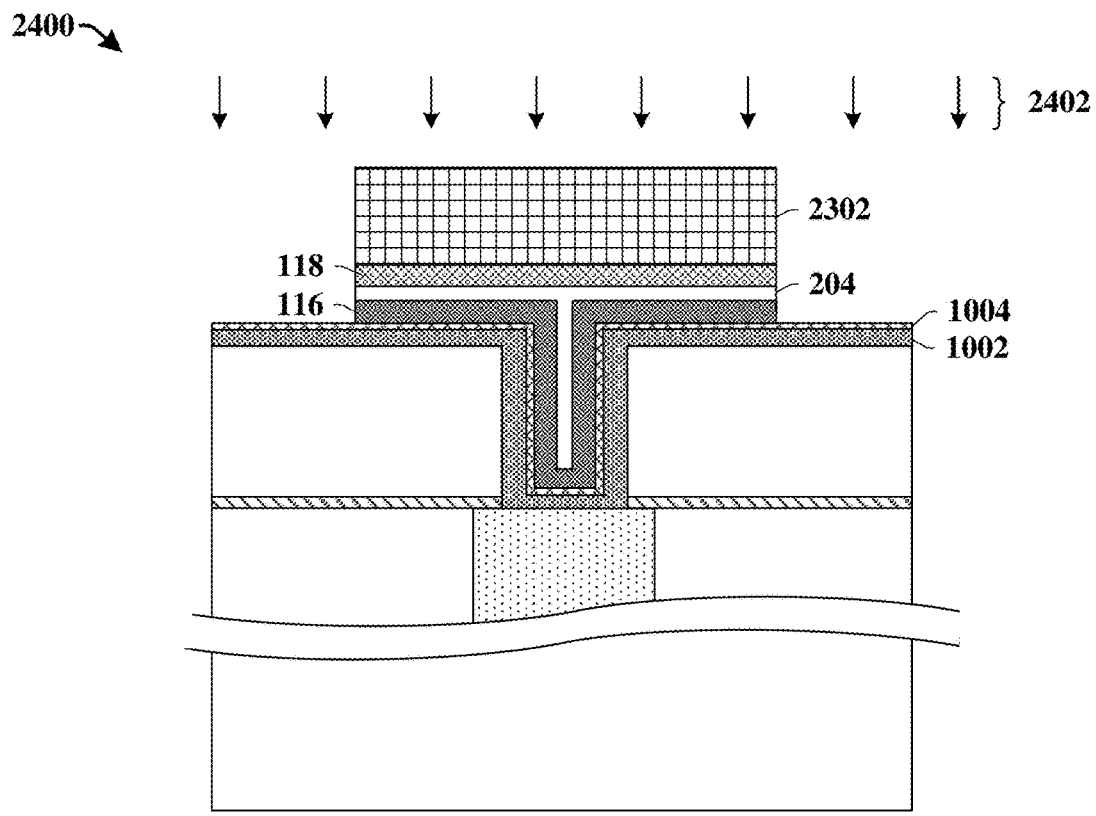

As shown in cross-sectional view 2400 of FIG. 24, a second etching process is performed according to the second mask 2302. The second etching process removes parts of the one or more capping layers (e.g., 1102 of FIG. 11), the dielectric layer (e.g., 1008 of FIG. 11), and the upper electrode layer (e.g., 1006 of FIG. 11) to define a capping structure 118, a dielectric 204, and an upper electrode 116. The second etching process also exposes an upper surface of the capacitor dielectric layer 1004. In some embodiments, the second etchant 2402 may comprise a dry etchant (e.g., a reactive ion etching (RIE) etchant, a plasma etchant, or the like). In some embodiments, the second etchant 2402 may have an etching chemistry comprising one or more tetrafluoromethane ($CF_4$), fluoroform ($CHF_3$), chlorine ($Cl_2$), nitrogen ($N_2$), argon (Ar), boron trichloride ($BCl_3$), or the like.

Figure 25:
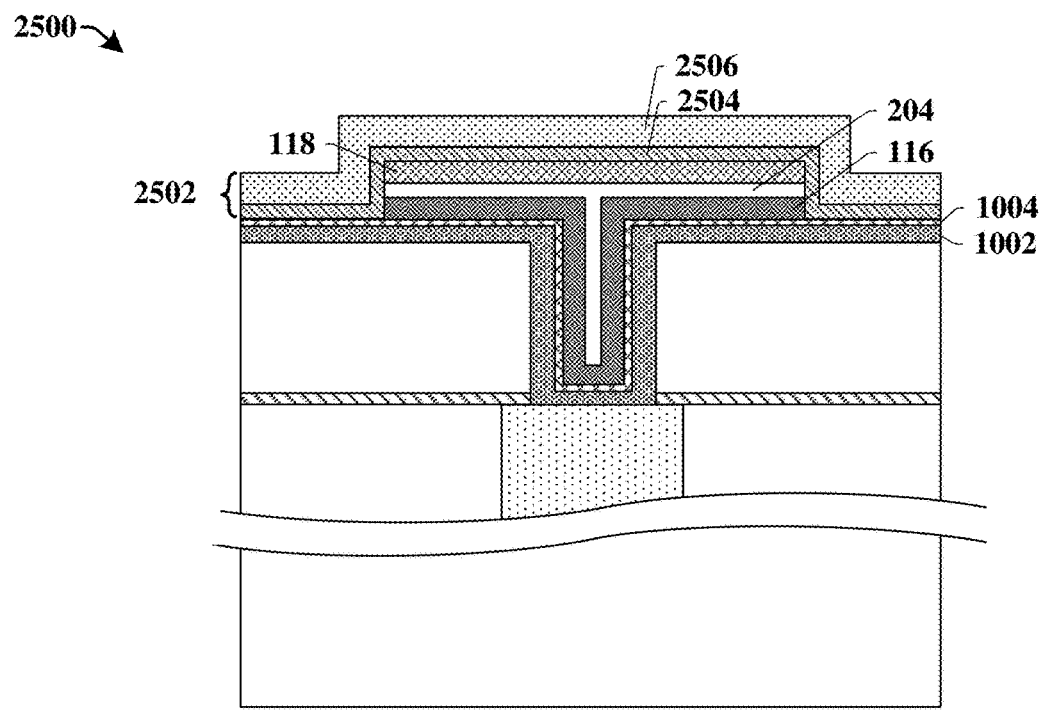

As shown in cross-sectional view 2500 of FIG. 25, a spacer structure 2502 is formed along horizontally extending surfaces of the capping structure 118 and the capacitor dielectric layer 1004 and also along sidewalls of the capping structure 118 and the upper electrode 116. In some embodiments, the spacer structure 2502 comprises a first dielectric layer 2504 and a second dielectric layer 2506 over the first dielectric layer 2504. The first dielectric layer 2504 and the second dielectric layer 2506 continuously extend between outermost sidewalls of the spacer structure 2502. In some embodiments, the spacer structure 2502 is formed to a thickness that is in a range of between approximately 100 Å and approximately 1500 Å, between approximately 50 Å and approximately 1000 Å, or other similar values.

Figure 26:
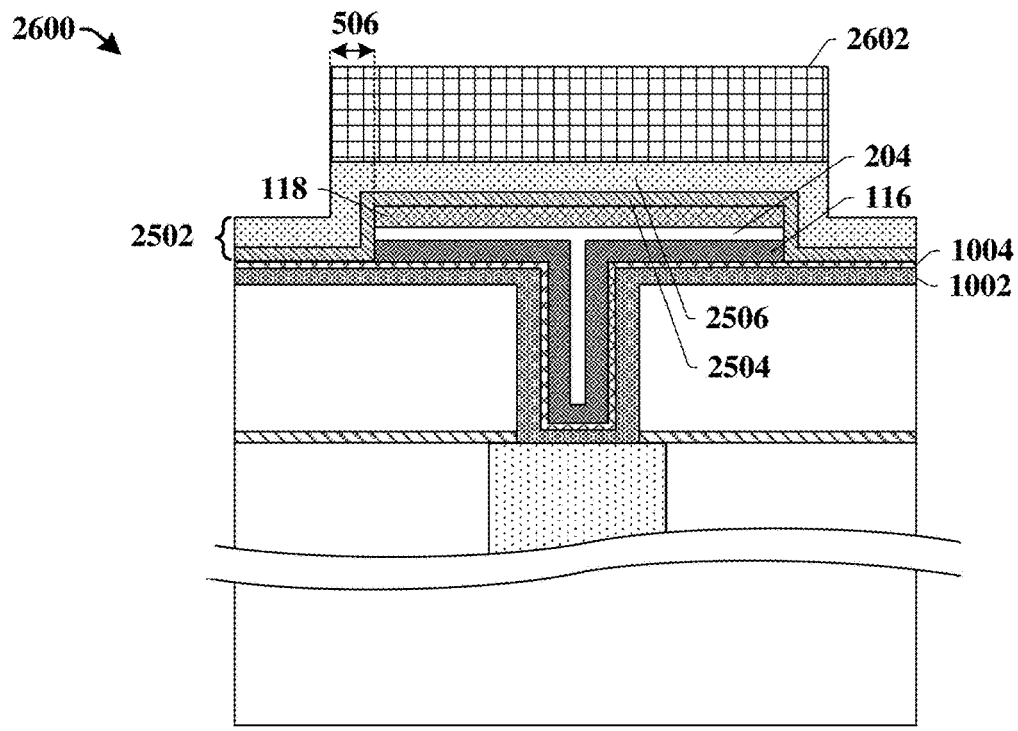

As shown in cross-sectional view 2600 of FIG. 26, a third mask 2602 is formed over the spacer structure 2502. In some embodiments, the third mask 2602 may extend past outermost sidewalls of the upper electrode 116 and the capping structure 118. In some embodiments, the third mask 2602 may extend a non-zero distance 506 past the outermost sidewalls of the upper electrode 116 and the capping structure 118. In some embodiments, the non-zero distance 506 may be in a range of between approximately 50 Å and approximately 750 Å. In some embodiments, the third mask 2602 may be completely confined above a topmost surface of the spacer structure (e.g., 2502 of FIG. 26). In such embodiments, the third mask 2602 may have a bottommost surface that is over a topmost surface of the spacer structure (e.g., 2502 of FIG. 26). In some embodiments, the third mask 2602 may comprise a photosensitive material (e.g., photoresist), a hard mask, or the like.

Figure 27:
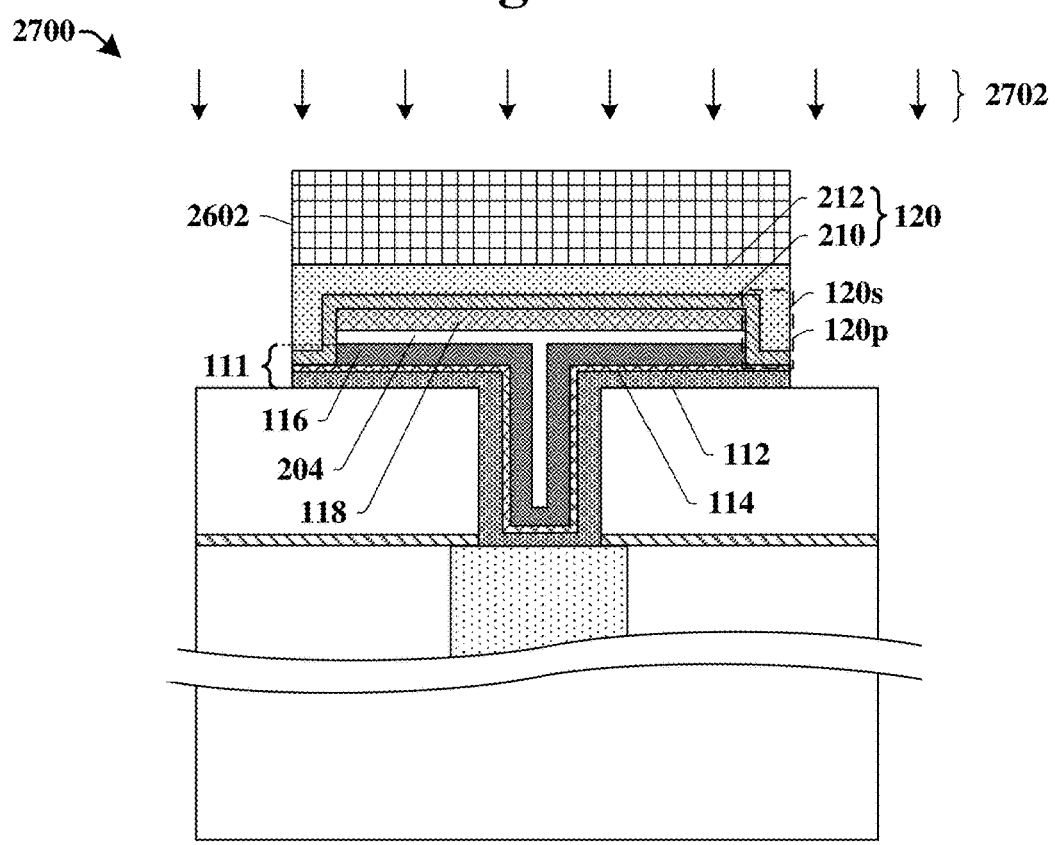

As shown in cross-sectional view 2700 of FIG. 27, a third etching process is performed to expose the spacer structure (e.g., 2502 of FIG. 26) to a third etchant 2702 according to the third mask 2602. The third etchant 2702 removes unmasked parts of the spacer structure (e.g., 2502 of FIG. 26) to define a spacer 120. In some embodiments, parts of the lower electrode layer (e.g., 1002 of FIG. 26) and the capacitor dielectric layer (e.g., 1004 of FIG. 26) are subsequently exposed to a fourth etchant according to the spacer 120 to define a lower electrode 112 and a capacitor dielectric 114 of a MIM capacitor structure 111. Since the lower electrode layer and the capacitor dielectric layer are etched according to the spacer 120, the spacer 120 has an outermost sidewall that is substantially aligned with outermost sidewalls of the lower electrode 112 and the capacitor dielectric 114. In some embodiments, the fourth etchant may be a same etchant as the third etchant 2702 (e.g., as part of a continuous etching process that defines the spacer 120), while in other embodiments the fourth etchant may comprise an etchant that is separate and different than the third etchant 2702

Figure 28:
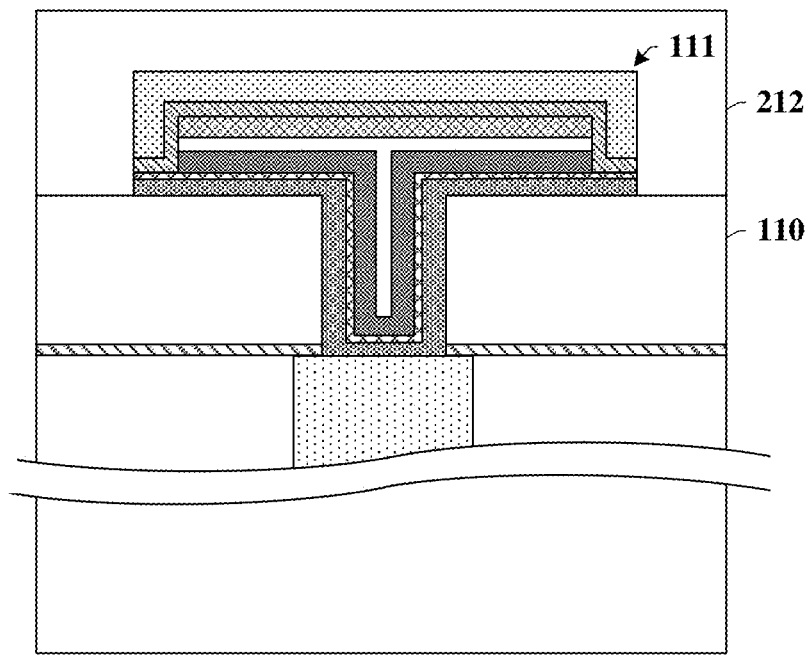

As shown in cross-sectional view 2800 of FIG. 28, a second dielectric layer 212 is formed over the MIM capacitor structure 111 and the first dielectric layer 110.

Figure 29:
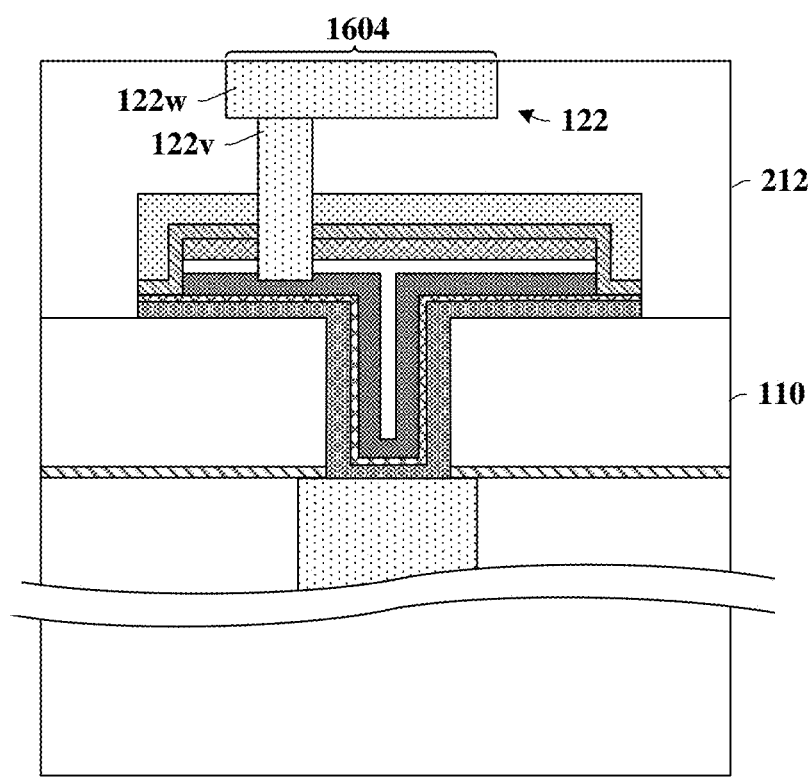

As shown in cross-sectional view 2900 of FIG. 29, an upper interconnect structure 122 is subsequently formed within one or more upper interconnect openings 1602 within the second dielectric layer 212. In some embodiments, the upper interconnect structure 122 may comprise an upper interconnect via 122v and an upper interconnect wire 122w.

Figure 30:
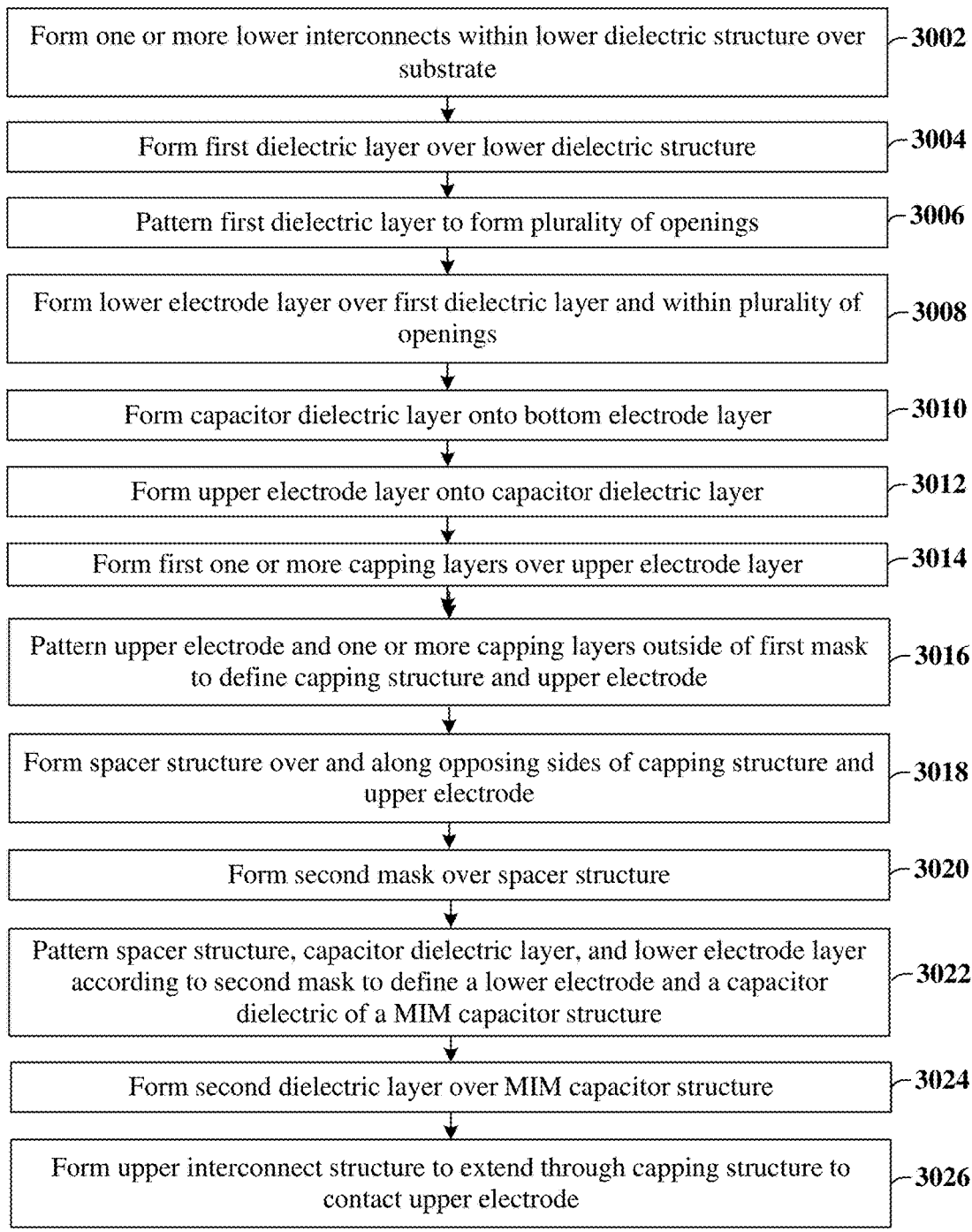
FIG. 30 illustrates a flow diagram of some alternative embodiments of a method of forming an integrated chip having a high density MIM capacitor structure.

FIG. 30 illustrates a flow diagram of some alternative embodiments of a method 3000 of forming an integrated chip having a high density MIM capacitor structure.

At act 3002, one or more lower interconnects are formed within a lower dielectric structure over a substrate. FIG. 19 illustrates a cross-sectional view 1900 of some embodiments corresponding to act 3002.

At act 3004, a first dielectric layer is formed over the lower dielectric structure. FIG. 20 illustrates a cross-sectional view 2000 of some embodiments corresponding to act 3004.

At act 3006, the first dielectric layer is patterned to form a plurality of openings. FIGS. 21A-21B illustrate cross-sectional views 2100-2102 of some embodiments corresponding to act 3006.

At act 3008, a lower electrode layer is formed over the first dielectric layer and within the plurality of openings. FIG. 22 illustrates a cross-sectional view 2200 of some embodiments corresponding to act 3008.

At act 3010, a capacitor dielectric layer is formed onto the lower electrode layer. FIG. 22 illustrates a cross-sectional view 2200 of some embodiments corresponding to act 3010.

At act 3012, an upper electrode layer is formed onto the capacitor dielectric layer. FIG. 22 illustrates a cross-sectional view 2200 of some embodiments corresponding to act 3012.

At act 3014, one or more capping layers are formed over the upper electrode layer. FIG. 23 illustrates a cross-sectional view 2300 of some embodiments corresponding to act 3014.

At act 3016, the one or more capping layers and the upper electrode layer are patterned outside of to a first mask to define a capping structure and an upper electrode. FIGS. 23-24 illustrate cross-sectional views 2300-2400 of some embodiments corresponding to act 3016.

At act 3018, a spacer structure is formed over and along opposing sides of the upper electrode and the capping structure. FIG. 25 illustrates a cross-sectional view 2500 of some embodiments corresponding to act 3018.

At act 3020, a second mask is formed over the spacer structure. FIG. 26 illustrates a cross-sectional view 2600 of some embodiments corresponding to act 3020.

At act 3022, the spacer structure, the lower electrode layer, and the capacitor dielectric layer are patterned according to the second mask to define a lower electrode and a capacitor dielectric of a MIM capacitor structure. FIG. 27 illustrates a cross-sectional view 2700 of some embodiments corresponding to act 3022.

At act 3024, a second dielectric layer is formed over the MIM capacitor structure. FIG. 28 illustrates a cross-sectional view 2800 of some embodiments corresponding to act 3024.

At act 3026, an upper interconnect structure is formed to extend through the capping structure to contact the upper electrode. FIG. 29 illustrate cross-sectional views 2900 of some embodiments corresponding to act 3026.

Accordingly, in some embodiments, the present disclosure relates to a method of forming a MIM device having upper and lower electrodes with footprints having similar sizes (e.g., having sizes that are within approximately 10% of one another).

In some embodiments, the present disclosure relates to a method of forming a capacitor structure that includes forming a capacitor dielectric layer over a lower electrode layer;

forming an upper electrode layer over the capacitor dielectric layer; etching the upper electrode layer to define an upper electrode and to expose a part of the capacitor dielectric layer; forming a spacer structure over horizontally extending surfaces of the upper electrode layer and the capacitor dielectric layer and also along sidewalls of the upper electrode; etching the spacer structure to remove the spacer structure from over the horizontally extending surfaces of the upper electrode layer and the capacitor dielectric layer and to define a spacer; and etching the capacitor dielectric layer and the lower electrode layer according to the spacer to define a capacitor dielectric and a lower electrode. In some embodiments, the method may further include forming one or more capping layers over the upper electrode layer; etching the one or more capping layers to define a capping structure; and forming the spacer structure over a horizontally extending surface of the capping structure and along sidewalls of the capping structure. In some embodiments, the method may further include forming a dielectric layer over the upper electrode layer and between sidewalls of the upper electrode layer prior to forming the one or more capping layers, a first etching process that etches the upper electrode layer to define the upper electrode also removes a part of the dielectric layer. In some embodiments, material from the lower electrode layer is re-deposited onto sidewalls of the spacer and the capacitor dielectric layer during etching of the lower electrode layer. In some embodiments, the spacer structure includes a first dielectric and a second dielectric arranged along sidewalls and a lower surface of the first dielectric. In some embodiments, an outermost sidewall of the lower electrode is aligned with an outermost surface of the spacer. In some embodiments, the method further includes forming one or more lower interconnects within a lower dielectric structure over a substrate; forming a first dielectric layer over the lower dielectric structure; and patterning the first dielectric layer to define a plurality of openings that extend through the first dielectric layer to expose the one or more lower interconnects, the lower electrode layer, the upper electrode layer, and the capacitor dielectric layer being formed within the plurality of openings and over the first dielectric layer. In some embodiments, a patterning process that etches the lower electrode layer also removes a part of the first dielectric layer. In some embodiments, the plurality of openings respectively have a substantially rectangular shape as viewed from a top-view of the first dielectric layer. In some embodiments, the plurality of openings are arranged in an array including a first plurality of openings arranged in a first column extending in a first direction and further including a second plurality of openings arranged in a first row extending in a second direction that is perpendicular to the first direction. In some embodiments, the upper electrode covers between approximately 90% and approximately 95% of the lower electrode.

In other embodiments, the present disclosure relates to a method of forming a capacitor structure that includes forming one or more lower interconnects within a lower dielectric structure over a substrate; forming a first dielectric layer over the lower dielectric structure; forming a plurality of openings extending through the first dielectric layer to expose the one or more lower interconnects; forming a capacitor stack over the first dielectric layer and within the plurality of openings, the capacitor stack having a capacitor dielectric layer between a lower electrode layer and an upper electrode layer; forming one or more capping layers over the upper electrode layer; etching the one or more capping layers and the upper electrode layer to define a capping structure over an upper electrode; forming a spacer along sidewalls of the capping structure and the upper electrode, the spacer having an outermost surface that extends from the capacitor dielectric layer to a top of the spacer; and etching the capacitor dielectric layer and the lower electrode layer according to the spacer to define a capacitor dielectric over a lower electrode. In some embodiments, the method further includes forming a second dielectric layer onto the first dielectric layer and along a sidewall of the first dielectric layer; and forming one or more additional interconnects within the second dielectric layer, the one or more additional interconnects laterally separated from the lower electrode by the first dielectric layer and the second dielectric layer. In some embodiments, the method further includes patterning the second dielectric layer and the capping structure to form an upper interconnect opening that exposes the upper electrode; and forming a conductive material within the upper interconnect opening. In some embodiments, the lower electrode is completely confined below the spacer and the upper electrode. In some embodiments, the spacer continuously extends along a closed path around outermost sidewalls of the upper electrode.

In yet other embodiments, the present disclosure relates to a metal-insulator-metal (MIM) capacitor structure that includes one or more lower interconnects disposed within a lower dielectric structure over a substrate; a first dielectric layer over the lower dielectric structure, the first dielectric layer having sidewalls defining a plurality of openings extending through the first dielectric layer; a lower electrode arranged along the sidewalls and over an upper surface of the first dielectric layer; a capacitor dielectric arranged along sidewalls and an upper surface of the lower electrode; an upper electrode arranged along sidewalls and an upper surface of the capacitor dielectric; and a spacer along opposing outermost sidewalls of the upper electrode, the spacer having an outermost surface that extends from a lowermost surface of the spacer to a top of the spacer, the outermost surface being substantially aligned with an outermost sidewall of the lower electrode. In some embodiments, the outermost sidewall of the lower electrode is substantially aligned with a sidewall of the first dielectric layer. In some embodiments, the MIM capacitor structure further includes a capping structure over the upper electrode, the spacer covering sidewalls of the upper electrode and the capping structure; and the spacer having a first dielectric and a second dielectric, the first dielectric having a horizontally extending segment separating the second dielectric from the capacitor dielectric and a vertically extending segment separating the second dielectric from the upper electrode and the capping structure. In some embodiments, a collective footprint of both the upper electrode and the spacer is substantially equal to a footprint of the lower electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A metal-insulator-metal (MIM) capacitor structure, comprising:
   one or more lower interconnects disposed within a lower dielectric structure over a substrate;
   a first dielectric layer over the lower dielectric structure, wherein the first dielectric layer comprises sidewalls defining a plurality of openings extending through the first dielectric layer;
   a lower electrode arranged along the sidewalls and over an upper surface of the first dielectric layer and directly contacting an upper surface of the one or more lower interconnects;
   a capacitor dielectric arranged along sidewalls and an upper surface of the lower electrode;
   an upper electrode arranged along sidewalls and an upper surface of the capacitor dielectric; and
   a spacer along opposing outermost sidewalls of the upper electrode, wherein the spacer has an outermost surface that extends from a lowermost surface of the spacer to a top of the spacer, the outermost surface being substantially aligned with an outermost sidewall of the lower electrode.

2. The MIM capacitor structure of claim 1, wherein the outermost sidewall of the lower electrode is substantially aligned with an outer sidewall of the first dielectric layer.

3. The MIM capacitor structure of claim 1, further comprising:
   a capping structure over the upper electrode, wherein the spacer covers the opposing outermost sidewalls of the upper electrode and outermost sidewalls of the capping structure; and
   wherein the spacer comprises a first dielectric and a second dielectric, the first dielectric having a horizontally extending segment separating the second dielectric from the capacitor dielectric and a vertically extending segment separating the second dielectric from the upper electrode and the capping structure.

4. The MIM capacitor structure of claim 1, wherein a collective footprint of both the upper electrode and the spacer is substantially equal to a footprint of the lower electrode.

5. The MIM capacitor structure of claim 1, further comprising:
   an upper dielectric having a sidewall covering the outermost surface of the spacer and the outermost sidewall of the lower electrode.

6. The MIM capacitor structure of claim 1, further comprising:
   a second dielectric layer arranged along sidewalls of the first dielectric layer and along the outermost surface of the spacer.

7. The MIM capacitor structure of claim 1, wherein the spacer comprises a first upper surface laterally outside of the upper electrode and a second upper surface directly over the upper electrode, the second upper surface being vertically above the first upper surface.

8. The MIM capacitor structure of claim 1, wherein the spacer comprises a first upper surface arranged along a first side of the upper electrode, a second upper surface arranged along an opposing second side of the upper electrode, and a third upper surface directly over the upper electrode, the third upper surface being vertically above the first upper surface and the second upper surface.

9. The MIM capacitor structure of claim 8, wherein the first upper surface has a different width than the second upper surface.

10. The MIM capacitor structure of claim 1, further comprising:
    an interconnect via extending through the spacer along an opening formed by sidewalls of the spacer, the sidewalls being directly over the upper electrode.

11. The MIM capacitor structure of claim 1, wherein the spacer comprises a first upper surface along a first side of the upper electrode, a second upper surface along an opposing second side of the upper electrode, and a third upper surface laterally between the first upper surface and the second upper surface, the second upper surface being vertically between the first upper surface and the third upper surface.

12. A metal-insulator-metal (MIM) capacitor structure, comprising:
    one or more lower interconnects disposed within a lower dielectric structure over a substrate;
    a first dielectric layer over the lower dielectric structure, wherein the first dielectric layer comprises one or more sidewalls forming one or more openings extending through the first dielectric layer;
    a lower electrode arranged along the one or more sidewalls and over an upper surface of the first dielectric layer;
    a capacitor dielectric arranged along one or more sidewalls and an upper surface of the lower electrode;
    an upper electrode arranged along one or more sidewalls and an upper surface of the capacitor dielectric;
    a spacer along opposing outermost sidewalls of the upper electrode and over the capacitor dielectric; and
    an upper dielectric arranged over the lower dielectric structure and having a sidewall arranged along sidewalls of the first dielectric layer, the lower electrode, and the spacer.

13. The MIM capacitor structure of claim 12, further comprising:
    an etch stop layer arranged between the lower dielectric structure and the first dielectric layer, wherein the upper dielectric continuously extends from directly over the upper electrode to the etch stop layer.

14. The MIM capacitor structure of claim 12, further comprising:
    one or more conductive byproducts arranged between the upper dielectric and the sidewalls of the lower electrode and the spacer.

15. The MIM capacitor structure of claim 14, wherein the spacer laterally separates the one or more conductive byproducts from the upper electrode.

16. The MIM capacitor structure of claim 12, wherein the upper dielectric vertically extends from directly over the upper electrode to vertically below a lower surface of the lower electrode.

17. The MIM capacitor structure of claim 12, wherein the spacer comprises a first layer and a second layer over an upper surface of the first layer, the first layer and the second layer both vertically extending from below the upper electrode to over a top of the upper electrode.

18. The MIM capacitor structure of claim 12, wherein the spacer continuously extends from along the opposing outermost sidewalls of the upper electrode to directly over the upper electrode.

19. A metal-insulator-metal (MIM) capacitor structure, comprising:
    one or more lower interconnects disposed within a lower dielectric structure over a substrate;
    a first dielectric layer over the lower dielectric structure, wherein the first dielectric layer comprises sidewalls forming a plurality of openings extending through the first dielectric layer, the plurality of openings arranged in an array having a plurality of rows of openings extending along a first direction and a plurality of columns of openings extending along a second direction perpendicular to the first direction;
- a lower electrode arranged along the sidewalls and over an upper surface of the first dielectric layer;
- a capacitor dielectric arranged along sidewalls and an upper surface of the lower electrode;
- an upper electrode arranged along sidewalls and an upper surface of the capacitor dielectric; and
- a spacer disposed over the capacitor dielectric and continuously wrapping around an outermost perimeter of the upper electrode in a closed loop surrounding the plurality of openings.

20. The MIM capacitor structure of claim 19, wherein the spacer comprises a first upper surface arranged along a first side of the upper electrode, a second upper surface arranged along an opposing second side of the upper electrode, and a third upper surface directly over the upper electrode, the third upper surface being vertically above the first upper surface and the second upper surface and the first upper surface having a different width than the second upper surface.

* * * * *